(12) United States Patent
Ikarashi et al.

(10) Patent No.: US 7,063,904 B2
(45) Date of Patent: Jun. 20, 2006

(54) EXCHANGE COUPLING FILM, MAGNETIC DETECTING ELEMENT USING THE EXCHANGE COUPLING FILM, AND METHOD OF MAKING SAME

(75) Inventors: Kazuaki Ikarashi, Niigata-ken (JP); Naoya Hasegawa, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/421,585

(22) Filed: Apr. 23, 2003

(65) Prior Publication Data

US 2003/0203241 A1   Oct. 30, 2003

(30) Foreign Application Priority Data

Apr. 23, 2002  (JP)  .............................. 2002-120808

(51) Int. Cl.
*G11B 5/127* (2006.01)

(52) U.S. Cl. ............. 428/692; 360/324.11; 360/324.12

(58) Field of Classification Search ................ 428/692; 360/324.11, 324.12
See application file for complete search history.

(56) References Cited

U.S. PATENT DOCUMENTS

| | | | |
|---|---|---|---|
| 5,668,687 A | 9/1997 | Chen et al. | |
| 5,795,663 A | 8/1998 | Koike et al. | |
| 6,607,641 B1 * | 8/2003 | Saito et al. | ............... 204/192.2 |
| 6,648,985 B1 * | 11/2003 | Saito et al. | ................. 148/121 |
| 6,678,128 B1 * | 1/2004 | Saito et al. | ............ 360/324.11 |
| 6,790,541 B1 * | 9/2004 | Saito et al. | ................. 428/692 |
| 2001/0013999 A1 | 8/2001 | Koi et al. | |
| 2001/0043986 A1 * | 11/2001 | Saito et al. | .................. 427/130 |
| 2001/0047930 A1 | 12/2001 | Saito et al. | |
| 2001/0053053 A1 * | 12/2001 | Saito et al. | ............ 360/324.11 |
| 2002/0018919 A1 * | 2/2002 | Saito et al. | ............ 428/694 TS |
| 2003/0106616 A1 * | 6/2003 | Saito et al. | .................. 148/121 |
| 2003/0111335 A1 * | 6/2003 | Saito et al. | .............. 204/192.2 |
| 2004/0160707 A1 * | 8/2004 | Saito et al. | ............ 360/324.11 |

FOREIGN PATENT DOCUMENTS

| | | |
|---|---|---|
| EP | 0 763 819 A1 | 3/1997 |
| JP | 2001-297916 | 10/2001 |
| JP | 2001-297917 | 10/2001 |
| WO | WO 02/088765 | 11/2002 |

OTHER PUBLICATIONS

JPO Abstract of JP 2001-297913-A.*
JPO Abstract of JP 2001-297915-A.*
JPO Abstract of JP 2001-297914-A.*

* cited by examiner

*Primary Examiner*—Kevin M. Bernatz
(74) *Attorney, Agent, or Firm*—Brinks Hofer Gilson & Lione

(57) ABSTRACT

Each of an antiferromagnetic layer and a pinned magnetic layer has a region containing a Cr element, thereby increasing an exchange coupling magnetic field (Hex) produced between the antiferromagnetic layer and the pinned magnetic layer. Therefore, the exchange coupling magnetic field produced between the antiferromagnetic layer and the pinned magnetic layer can be increased, and a coupling magnetic field due to RKKY interaction can also be increased, thereby increasing a one-directional exchange bias magnetic field (Hex*) in the pinned magnetic layer as compared with a conventional exchange coupling film.

12 Claims, 11 Drawing Sheets

EXCHANGE COUPLING FILM, MAGNETIC DETECTING ELEMENT USING THE EXCHANGE COUPLING FILM, AND METHOD OF MAKING SAME

BACKGROUND OF THE INVENTION

1. Field of the Invention

The present invention relates to an exchange coupling film which comprises an antiferromagnetic layer and a ferromagnetic layer and which produces an exchange coupling magnetic field (Hex) at the interface between the antiferromagnetic layer and the ferromagnetic layer to align a magnetization direction of the ferromagnetic layer in a predetermined direction, a method of producing the exchange coupling film, and a magnetic detecting element using the exchange coupling film. Particularly, the present invention relates to an exchange coupling film capable of improving an exchange coupling magnetic field (Hex), a method of producing the exchange coupling film, and a magnetic detecting element using the exchange coupling film.

2. Description of the Related Art

FIG. 17 is a partial sectional view of a structure of a conventional magnetic detecting element, as viewed from a side facing a recording medium.

In FIG. 17, reference numeral 101 denotes a substrate on which a multilayer film 108 comprising an antiferromagnetic layer 102, a pinned magnetic layer 103, a nonmagnetic material layer 104, and a free magnetic layer 105 is formed. Furthermore, hard bias layers 106 are formed on both sides of the multilayer film 108, and electrode layers 107 are respectively formed on the hard bias layers 106. The antiferromagnetic layer 102 is made of an antiferromagnetic material, and the pinned magnetic layer 103 and the free magnetic layer 105 are made of a ferromagnetic material. Namely, the antiferromagnetic layer 102 and the pinned magnetic layer 103 constitute an exchange coupling film in which a magnetization direction of the ferromagnetic layer is aligned in a predetermined direction by an exchange coupling magnetic field (Hex) produced at the interface between the antiferromagnetic layer 102 and the pinned magnetic layer 103.

The magnetization direction of the pinned magnetic layer 103 is pinned in the Y direction shown in the drawing by the exchange coupling magnetic field produced between the antiferromagnetic layer 102 and the pinned magnetic layer 103. On the other hand, the magnetization of the free magnetic layer 105 is aligned in the X direction shown in the drawing by a longitudinal bias magnetic field from the hard bias layers 106.

The magnetization direction of the free magnetic layer 105 varies sensitively to an external magnetic field from the recording medium, and the electric resistance changes based on the relation between the change in the magnetization direction and the pinned magnetization direction of the pinned magnetic layer 103. Therefore, a leakage magnetic field from the recording medium is detected by a change in voltage or current based on the change in the electric resistance.

As shown in FIG. 17, the optical track width O-Tw of the magnetic detecting element is regulated by the width dimension of the free magnetic layer 105 in the track width direction (the X direction shown in the drawing), and the dimension of the track width Tw decreases more and more as the recording density increases.

As the optical track width O-Tw of the magnetic detecting element decreases, the dimensions of the multilayer film 108 decrease, and the track width dimensions of the antiferromagnetic layer 102 and the pinned magnetic layer 103 also decrease.

The thickness dimension (in the Z direction shown in the drawing) of the multilayer film 108 must be decreased for further narrowing the gap of the magnetic detecting element. In order to decrease the thickness dimension of the multilayer film 108, the thickness of each of the antiferromagnetic layer 102, the pinned magnetic layer 103, the nonmagnetic material layer 104 and the free magnetic layer 105 must be decreased. Particularly, it is effective to decrease the thickness of the antiferromagnetic layer 102 having the largest thickness.

However, when the track width dimensions of the antiferromagnetic layer 102 and the pinned magnetic layer 103, and the thickness dimension of the antiferromagnetic layer 102 are decreased, the exchange coupling magnetic field produced between the antiferromagnetic layer 102 and the pinned magnetic layer 103 is decreased, causing difficulties in securely pinning the magnetization direction of the pinned magnetic layer 103 in a direction.

Also, when the track width dimensions of the antiferromagnetic layer 102 and the pinned magnetic layer 103 are decreased, the magnetization direction of the pinned magnetic layer 103 is easily inclined by the hard bias magnetic field. When the element height direction dimensions (in the Y direction) of the antiferromagnetic layer 102 and the pinned magnetic layer 103 are decreased, a demagnetizing field is increased to easily incline the magnetization direction of the pinned magnetic layer 103.

Therefore, it is difficult to maintain a constant crossing angle between the magnetization directions of the pinned magnetic layer 103 and the free magnetic layer 105, thereby causing the problem of increasing a degree of asymmetry of an output signal waveform.

When the pinned magnetic layer 103 cannot be properly pinned, the resistance to a damage due to electrostatic discharge (ESD) is weakened to cause the problem of deteriorating communication reliability.

SUMMARY OF THE INVENTION

The present invention resolves the above-described problems of the conventional detecting element, and an object of the present invention is to provide an exchange coupling film comprising an antiferromagnetic layer and a ferromagnetic layer, and producing a great exchange coupling magnetic field at the interface between both layers, a method of producing the exchange coupling film, and a magnetic detecting element using the exchange coupling film.

In a first aspect of the present invention, an exchange coupling film comprises a laminate of an antiferromagnetic layer and a ferromagnetic layer, wherein the magnetization direction of the ferromagnetic layer is fixed in a direction by an exchange coupling magnetic field produced at the interface between the antiferromagnetic layer and the ferromagnetic layer, and the antiferromagnetic layer contains a Cr element with a concentration gradient in the thickness direction.

In the exchange coupling film, the antiferromagnetic layer and/or the ferromagnetic layer may contain a Cr element with a concentration gradient in the thickness direction.

It was found that when the antiferromagnetic layer and/or the ferromagnetic layer contains a Cr element, the exchange coupling magnetic field (Hex) produced between the antiferromagnetic layer and the ferromagnetic layer is higher than that in a case in which a Cr element is not contained.

It was also found that the exchange coupling magnetic field (Hex) produced between the antiferromagnetic layer and the ferromagnetic layer both of which contain a Cr element with changes in concentrations is higher than that produced between the layers when both contain a Cr element at a constant concentration over the entire region.

In the present invention, the Cr element is preferably present at the interface between the antiferromagnetic layer and the ferromagnetic layer.

In the present invention, the Cr element is present near the interface between the antiferromagnetic layer and the ferromagnetic layer, so that the exchange coupling magnetic field (Hex) produced between the antiferromagnetic layer and the ferromagnetic layer is effectively increased.

However, when a Cr element is mixed over the entire region of an antiferromagnetic material, the antiferromagnetic properties of the antiferromagnetic material tend to deteriorate. Therefore, the antiferromagnetic layer having a region not containing the Cr element is more preferable than the antiferromagnetic layer containing the Cr element over the entire region.

The present invention includes various types of Cr element concentration gradients.

A first type of gradient is a type in which the Cr element concentration in the exchange coupling film reaches a maximum at the interface between the antiferromagnetic layer and the ferromagnetic layer, and the content gradually decreases in the direction away from the interface.

A second type of gradient is a type in which the Cr element concentration in the exchange coupling film reaches a maximum in a predetermined region at a distance from the interface within the antiferromagnetic layer, and gradually decreases in the direction away from the predetermined region.

A third type of gradient is a type in which the Cr element concentration in the exchange coupling film reaches a maximum at a distance from the interface in a predetermined region of the ferromagnetic layer, and gradually decreases in the direction away from the predetermined region.

A fourth type of gradient is a type in which the Cr element concentration in the exchange coupling film is constant within a predetermined region of the antiferromagnetic layer near the interface between the antiferromagnetic layer and the ferromagnetic layer.

In the present invention, the maximum Cr element content in the antiferromagnetic layer is preferably higher than that in the ferromagnetic layer because the intensity of the exchange coupling magnetic field can easily be made constant.

Also, in order to suppress deterioration in the antiferromagnetic properties of the antiferromagnetic layer due to mixing of the Cr element, it is effective that except for Cr, the atomic ratio (at %) of each element of an alloy composition of the antiferromagnetic layer is constant in the antiferromagnetic layer.

In the present invention, the antiferromagnetic layer preferably comprises a PtMn alloy, a X—Mn (wherein X is at least one element of Pd, Ir, Rh, Ru, and Os) alloy or a Pt—Mn—X' (wherein X' is at least one element of Pd, Ir, Rh, Ru, Au, Ag, Os, Ni, Ar, Ne, Xe, and Kr) alloy, and the Cr element.

The PtMn alloy, the X—Mn alloy or the Pt—Mn—X' alloy has a disordered face-centered cubic structure (fcc) immediately after deposition. However, this fcc structure can be transformed into a CuAuI-type ordered face-centered tetragonal structure (fct) by a heat treatment to produce a great exchange coupling magnetic field at the interface with the ferromagnetic layer.

In the present invention, the Cr element is thought to have the function to promote ordering transformation of the PtMn alloy, the X—Mn alloy or the Pt—Mn—X' alloy.

In a heat treatment of the antiferromagnetic layer comprising the PtMn alloy, the X—Mn alloy or the Pt—Mn—X' alloy laminated on the ferromagnetic layer, the PtMn alloy, the X—Mn alloy or the Pt—Mn—X' alloy is transformed into an ordered structure. However, the vicinity of the interface between the antiferromagnetic layer and the ferromagnetic layer is not easily transformed into the ordered structure. When the Cr element is present near the interface between the antiferromagnetic layer and the ferromagnetic layer, the vicinity of the interface is nearly completely transformed into the ordered structure as compared with a case in which the Cr element is absent. As a result, the exchange coupling magnetic field produced at the interface is possibly increased.

In the present invention, the antiferromagnetic layer has, for example, a CuAuI-type crystal structure, and the lattice points of a crystal lattice composed of Pt and Mn, the lattice points of a crystal structure composed of the element X and Mn, or the lattice points of a crystal lattice composed of the elements Pt, Mn and X' are partially substituted by the Cr element.

The ferromagnetic layer preferably has a laminated ferrimagnetic structure comprising a first magnetic layer juxtapositionally in contact with the antiferromagnetic layer, and a second magnetic layer opposing the first magnetic layer with a nonmagnetic intermediate layer provided therebetween.

When the ferromagnetic layer has the laminated ferrimagnetic structure, the first magnetic layer preferably has a region containing the Cr element near the interface with the antiferromagnetic layer, and a region not containing the Cr element near the interface with the nonmagnetic intermediate layer.

When the magnetic region not containing the Cr element is present near the interface with the nonmagnetic intermediate, a coupling magnetic field due to a Ruderman-Kittel-Kasuya-Yosida (RKKY) interaction between the first and second magnetic layers through the nonmagnetic intermediate layer is higher than that in a case in which the magnetic region containing the Cr element is formed in contact with the nonmagnetic intermediate layer.

Therefore, the exchange coupling magnetic field (Hex) produced between the first magnetic layer and the antiferromagnetic layer can be increased, and the coupling magnetic field due to the RKKY interaction can be increased, thereby increasing a one-directional exchange bias magnetic field (Hex*) in the pinned magnetic layer as compared with a conventional exchange coupling film.

The Cr element content at the interface between the first magnetic layer and the antiferromagnetic layer may be higher than that at the interface with the nonmagnetic intermediate layer. In this case, a one-directional exchange bias magnetic field (Hex*) in the pinned magnetic layer can be increased, as compared with a conventional exchange coupling film.

However, in order to increase the coupling magnetic field due to the RKKY interaction produced between the first and second magnetic layers through the nonmagnetic intermediate layer, the magnetic region not containing the Cr element is preferably present near the interface with the nonmagnetic intermediate layer.

In another aspect of the present invention, a method of producing an exchange coupling film comprises a step of laminating an antiferromagnetic layer and a ferromagnetic layer with a Cr element layer provided therebetween, and a step of performing a heat treatment to produce an exchange coupling magnetic field between the antiferromagnetic layer and the ferromagnetic layer.

This method can form the exchange coupling film in which the Cr element content has a maximum at the interface between the antiferromagnetic layer and the ferromagnetic layer, and gradually decreases in the direction away from the interface.

In still another aspect of the present invention, a method of producing an exchange coupling film comprises a step of laminating a first antiferromagnetic layer and a second antiferromagnetic layer with a Cr element layer provided therebetween, a step of forming a ferromagnetic layer in contact with the first or second antiferromagnetic layer, and a step of performing a heat treatment to produce an exchange coupling magnetic field between the first or second antiferromagnetic layer and the ferromagnetic layer.

This method can form the exchange coupling film in which the Cr element content has a maximum in a predetermined region at a distance from the interface within the antiferromagnetic layer, and gradually decreases in the direction away from the predetermined region.

In the method comprising the step of laminating the first and second antiferromagnetic layers with the Cr element layer provided therebetween, the Cr element layer is preferably provided 2 Å to 20 Å apart from the interface between the first or second antiferromagnetic layer and the ferromagnetic layer. In this case, the Cr element layer is more preferably provided 2 Å to 5 Å apart from the interface between the first or second antiferromagnetic layer and the ferromagnetic layer.

In a further aspect of the present invention, a method of producing an exchange coupling film comprises a step of laminating a first ferromagnetic layer and a second ferromagnetic layer with a Cr element layer provided therebetween, a step of forming an antiferromagnetic layer in contact with the first or second ferromagnetic layer, and a step of performing a heat treatment to produce an exchange coupling magnetic field between the antiferromagnetic layer and the first or second ferromagnetic layer.

This method can form the exchange coupling film in which the Cr element content has a maximum in a predetermined region at a distance from the interface within the ferromagnetic layer, and gradually decreases in the direction away from the predetermined region.

In the method of producing the exchange coupling film of the present invention, the average thickness of the Cr element layer is preferably 0.1 Å to 2.0 Å, and more preferably 0.1 Å to 1.0 Å.

The average thickness of the Cr element layer can be measured by a fluorescent X-ray spectroscopic analyzer.

In the present invention, the average thickness of the Cr element layer may be less than 1 Å. As is generally known, a thickness of 1 Å corresponds to the diameter of one atom or less, and there is thus no uniform thin film of less than 1 Å thick. However, a thin film containing Cr atoms nonuniformely present, i.e., sparsely present, has a region containing Cr, and a region not containing Cr. As a result, when the average thickness of the Cr element layer is defined as described above, the average thickness of the Cr element layer is less than 1 Å in some cases.

In a still further aspect of the present invention, a method of producing an exchange coupling film comprises a step of laminating an antiferromagnetic material layer composed of an antiferromagnetic material, and a Cr-containing layer composed of the antiferromagnetic material to which a Cr element is added, to form an antiferromagnetic layer, a step of forming a ferromagnetic layer in contact with the Cr-containing layer, and a step of performing a heat treatment to produce an exchange coupling magnetic field between the antiferromagnetic layer and the ferromagnetic layer.

This method can form the exchange coupling film in which the Cr element content is constant in a predetermined region of the antiferromagnetic layer near the interface between the antiferromagnetic layer and the ferromagnetic layer.

In a further aspect of the present invention, a method of producing an exchange coupling film comprises a step of sputtering only a target composed of an antiferromagnetic material, a step of simultaneously sputtering both the target composed of the antiferromagnetic material and a target composed of a Cr element so that the antiferromagnetic material and the Cr element are mixed to form an antiferromagnetic layer containing the Cr element, a step of forming a ferromagnetic layer in contact with the antiferromagnetic layer, and a step of performing a heat treatment to produce an exchange coupling magnetic field between the antiferromagnetic layer and the ferromagnetic layer.

The exchange coupling film formed by the producing method of the present invention comprises the ferromagnetic layer and the antiferromagnetic layer containing the Cr element with a concentration gradient, so that the exchange coupling magnetic field (Hex) produced between the antiferromagnetic layer and the ferromagnetic layer is higher than that in a case in which the Cr element is not contained.

The exchange coupling film formed by the producing method of the present invention may comprise the ferromagnetic layer and the antiferromagnetic layer both of which contain the Cr element with a concentration gradient, so that the exchange coupling magnetic field (Hex) produced between the antiferromagnetic layer and the ferromagnetic layer is higher than that in a case in which the Cr element is not contained.

The exchange coupling film formed by the producing method of the present invention may comprise the antiferromagnetic layer and the ferromagnetic layer containing the Cr element with a concentration gradient, so that the exchange coupling magnetic field (Hex) produced between the antiferromagnetic layer and the ferromagnetic layer is higher than that in a case in which the Cr element is not contained.

A magnetic detecting element of the present invention comprises the above-described exchange coupling film of the present invention.

A magnetic detecting element comprises an antiferromagnetic layer, a pinned magnetic layer, a nonmagnetic intermediate layer, and a free magnetic layer, wherein the magnetization of the free magnetic layer is aligned in a direction crossing the magnetization direction of the pinned magnetic layer, and the antiferromagnetic layer and the pinned magnetic layer constitute the exchange coupling film of the present invention.

A magnetic detecting element comprises nonmagnetic intermediate layers laminated on and below a free magnetic layer, fixed magnetic layers provided on one of the nonmagnetic intermediate layers and below the other nonmagnetic intermediate layer, antiferromagnetic layers provided on one of the pinned magnetic layers and below the other pinned magnetic layer, and a seed layer formed below the antiferromagnetic layer formed below the free magnetic layer, wherein magnetization of the free magnetic layer is aligned in a direction crossing the magnetization direction of the pinned magnetic layer, and the antiferromagnetic layer and the pinned magnetic layer constitute the exchange coupling film of the present invention.

The magnetic detecting element of the present invention uses the exchange coupling film comprising the pinned magnetic layer and the antiferromagnetic layer containing a Cr element with a concentration gradient in the thickness direction, so that the exchange coupling magnetic field produced between the antiferromagnetic layer and the pinned magnetic layer can be increased.

The magnetic detecting element of the present invention may use the exchange coupling film comprising the pinned magnetic layer and the antiferromagnetic layer both of which contain a Cr element with a concentration gradient in the thickness direction, so that the exchange coupling magnetic field produced between the antiferromagnetic layer and the pinned magnetic layer can be increased.

The magnetic detecting element of the present invention may use the exchange coupling film comprising the antiferromagnetic layer and the pinned magnetic layer containing a Cr element with a concentration gradient in the thickness direction, so that the exchange coupling magnetic field produced between the antiferromagnetic layer and the pinned magnetic layer can be increased.

Therefore, even when the track width dimensions of the antiferromagnetic layer and the pinned magnetic layer, and the thickness dimension and height dimension of the antiferromagnetic layer are decreased for further narrowing the track width and gap of the magnetic detecting element, the magnetization direction of the pinned magnetic layer can be securely pinned in a direction.

Namely, in the present invention, a crossing angle between the magnetization directions of the pinned magnetic layer and the free magnetic layer can be easily made constant, thereby decreasing a degree of asymmetry of an output signal waveform.

The magnetic detecting element of the present invention has a high resistance to a damage due to electrostatic discharge (ESD), thereby improving communication reliability.

DESCRIPTION OF THE PREFERRED EMBODIMENTS

Figure 1:
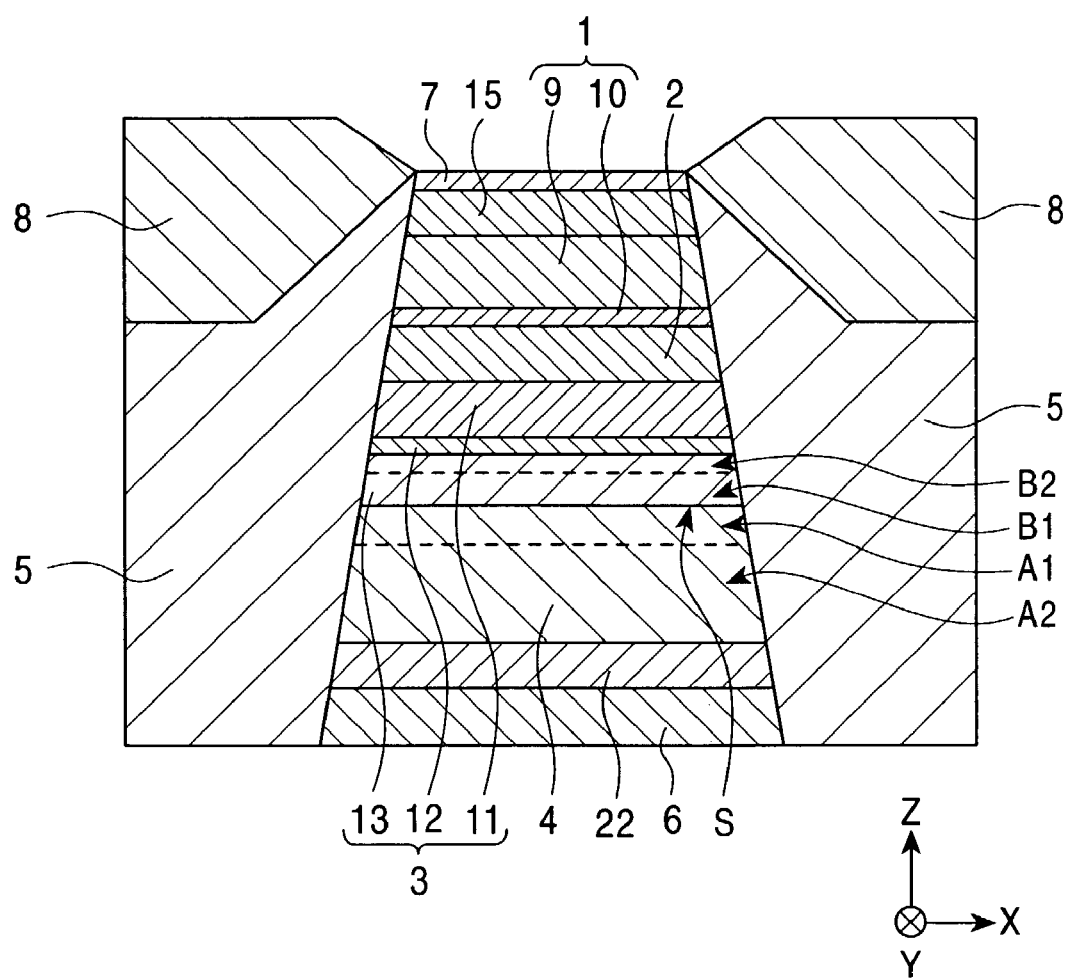
FIG. 1 is a sectional view of a structure of a magnetic detecting element (single spin-valve magnetoresistive element) according to a first embodiment of the present invention, as viewed from a side facing a recording medium.

FIG. 1 is a partial sectional view of the whole structure of a magnetic detecting element (single spin-valve magnetoresistive element) according to a first embodiment of the present invention, as viewed from a side facing a recording medium FIG. 1 shows only a central portion of the element in the X direction shown in the drawing.

The single spin-valve magnetoresistive element is provided at the trailing-side end of a floating slider provided on a hard disk device, for detecting a recording magnetic field from a hard disk. The Y direction coincides with the movement direction of a magnetic recording medium, and the Z direction coincides with the direction of a leakage magnetic field from the magnetic recording medium.

The bottom layer shown in FIG. 1 is an underlying layer 6 made of a nonmagnetic material composed of at least one element of Ta, Hf, Nb, Zr, Ti, Mo, and W. The underlying layer 6 is formed to a thickness of, for example, about 50 Å.

Also, a seed layer 22 is formed on the underlying layer 6. By forming the seed layer 22, a crystal grain size in parallel with the plane of each of layers formed on the seed layer 22 can be increased to properly improve electromigration resistance, and improve communication reliability and a rate of change in resistance ($\Delta R/R$).

The seed layer 22 is made of a NiFeCr alloy or Cr. When the seed layer 22 is made of the NiFeCr alloy, the composition is, for example, $(Ni_{0.8}Fe_{0.2})_{60at\%}Cr_{40at\%}$.

A pinned magnetic layer 3 formed on an antiferromagnetic layer 4 has a three-layer structure. The pinned magnetic layer 3 comprises a first magnetic layer 13 formed in contact with the antiferromagnetic layer 4, and a second magnetic layer 11 formed on the first magnetic layer 13 with a nonmagnetic intermediate layer 12 provided therebetween.

The material and film structure of the pinned magnetic layer 3 will be described in detail below.

A nonmagnetic material layer 2 is formed on the pinned magnetic layer 3. The nonmagnetic material layer 2 is made of, for example, Cu. When the magnetic detecting element of the present invention is a tunneling magnetoresistive element (TMR element) using the principle of a tunnel effect, the nonmagnetic material layer 2 is made of an insulating material, for example, $Al_2O_3$ or the like.

Furthermore, a free magnetic layer 1 comprising two layers is formed on the nonmagnetic material layer 2.

The free magnetic layer 1 comprises the two layers including a NiFe alloy film 9 and a CoFe alloy film layer 10. As shown in FIG. 1, the CoFe alloy film 10 is formed in contact with the nonmagnetic material layer 2 to prevent diffusion of metal elements through the interface with the nonmagnetic material layer 2, thereby increasing the rate of change in resistance ($\Delta R/R$).

The NiFe alloy film 9 is composed of, for example, 80 at % of Ni and 20 at % of Fe. The CoFe alloy film 10 is composed of, for example, 90 at % of Co and 10 at % of Fe. The NiFe alloy film 9 is formed to a thickness of, for example, about 45 Å, and the CoFe alloy film 10 is formed to a thickness of, for example, about 5 Å. Instead of the NiFe alloy film 9 and the CoFe alloy film 10, a Co alloy and a CoFeNi alloy may be used. The free magnetic layer 1 may be formed in a single layer structure comprising a magnetic material. In this case, the free magnetic layer 1 is preferably made of a CoFeNi alloy.

The free magnetic layer 1 may be formed in a laminated ferrimagnetic structure comprising magnetic layers laminated with a nonmagnetic intermediate layer provided therebetween.

Furthermore, a backed layer 15 comprising a metal material or a nonmagnetic metal such as Cu, Au or Ag is formed on the free magnetic layer 1. For example, the backed layer 15 is formed to a thickness of about 5 to 20 Å.

A protective layer 7 is formed on the backed layer 15 The protective layer 7 is preferably composed of Ta or the like, and has an oxide layer (specular reflection layer) formed by oxidation of its surface.

By forming the backed layer 15, the mean free path of +spin (up spin) electrons contributing to the magnetoresistive effect can be extended to obtain a high rate of change in resistance due to a so-called spin filter effect in a spin-valve magnetic element, thereby making it possible to comply with a higher recording density The backed layer 15 is not necessarily formed.

In the embodiment shown in FIG. 1, hard bias layers 5 and electrode layers 8 are formed on both sides of the laminated film ranging from the underlying layer 6 to the protective layer 7. Therefore, the magnetization of the free magnetic layer 1 is aligned in the track width direction (the X direction shown in the drawing) by a longitudinal bias magnetic field from the hard bias layers 5.

The hard bias layers 5 are made of, for example, a Co—Pt (cobalt-platinum) alloy or Co—Cr—Pt (cobalt-chromium-platinum) alloy, or the like, and the electrode layers 8 are made of α-Ta, Au, Ru, Cr, Cu (copper), W (tungsten), or the like. In the above-described tunneling magnetoresistive element or CPP magnetic detecting element, the electrode layers 8 are respectively formed on the free magnetic layer 1 and below the antiferromagnetic layer 4.

In this embodiment, an exchange coupling film of the present invention comprises the antiferromagnetic layer 4 and the pinned magnetic layer 3.

Namely, the antiferromagnetic layer 4 has a region A1 containing the Cr element with a concentration gradient in the thickness direction (the Z direction shown in the drawing), and the pinned magnetic layer 3 comprising a ferromagnetic layer in the exchange coupling film of the present invention has a region B1 containing the Cr element with a concentration gradient in the thickness direction (the Z direction shown in the drawing).

When the antiferromagnetic layer 4 and the pinned magnetic layer 3 have the regions A1 and B1, respectively, containing the Cr element, an exchange coupling magnetic field (Hex) produced between the antiferromagnetic layer 4 and the pinned magnetic layer 3 is higher than that in a case in which the Cr element is not contained.

In the magnetic detecting element shown in FIG. 1, the exchange coupling magnetic field (Hex) produced between the antiferromagnetic layer 4 and the pinned magnetic layer 3 can be effectively increased due to the presence of the Cr element at the interface between the antiferromagnetic layer 4 and the pinned magnetic layer 3.

However, when a Cr element is mixed in an antiferromagnetic material, antiferromagnetic properties tend to deteriorate. Therefore, in this embodiment, the antiferromagnetic layer 4 has a region A2 not containing the Cr element in order to suppress deterioration in the antiferromagnetic properties.

There are various types of Cr element concentration gradients.

A first type of gradient is a type in which the Cr element content has a maximum at the interface S between the antiferromagnetic layer 4 and the pinned magnetic layer 3, and gradually decreases in the direction away from the interface.

A second type of gradient is a type in which the Cr element content has a maximum in a predetermined region at a distance from the interface S within the antiferromagnetic layer 4, and gradually decreases in the direction away from the predetermined region.

A third type of gradient is a type in which the Cr element content has a maximum in a predetermined region at a distance from the interface S within the pinned magnetic layer 3, and gradually decreases in the direction away from the predetermined region.

A fourth type of gradient is a type in which the Cr element content in the exchange coupling film is constant in a predetermined region of the antiferromagnetic layer 4 near the interface S between the antiferromagnetic layer 4 and the pinned magnetic layer 3.

The Cr element concentration gradient of each of the antiferromagnetic layer 4 and the pinned magnetic layer 3 will be described in detail below.

Also, the maximum Cr element content in the antiferromagnetic layer 4 is preferably higher than that in the pinned magnetic layer 3.

In the present invention, the antiferromagnetic layer 4 preferably comprises a PtMn alloy, a X—Mn (wherein X is at least one element of Pd, Ir, Rh, Ru, and Os) alloy or a Pt—Mn—X' (wherein X' is at least one element of Pd, Ir, Rh, Ru, Au, Ag, Os, Ni, Ar, Ne, Xe, and Kr) alloy, and the Cr element.

These alloys composed of the platinum group metals have excellent properties as antiferromagnetic materials, such as high corrosion resistance, a high blocking temperature, and the ability to increase an exchange coupling magnetic field (Hex). Of the platinum group metals, particularly, Pt is preferably used, and, for example, a binary-system PtMn alloy can be used.

As the element X', an element which would enter into the interstices of a crystal lattice composed of the element X and Mn, or an element which would partially substitute for the lattice points of a crystal lattice composed of the element X and Mn is preferably used. Herein, a solid solution means a solid in which components are uniformly mixed over a wide range.

In an interstitial solid solution or substitutional solid solution, the lattice constants of a Pt—Mn—X' alloy can be increased, as compared with a X—Mn alloy. Therefore, the difference between the lattice constants of the antiferromagnetic layer 4 and the pinned magnetic layer 3 can be increased, and thus the interface structure between the antiferromagnetic layer 4 and the pinned magnetic layer 3 can easily be put into an incoherent state. The "incoherent state" means a state in which the constituent atoms of the antiferromagnetic layer 4 and the constituent atoms of the pinned magnetic layer 3 do not have one-to-one correspondence at the interface between both layers.

Particularly, in the use of the element X' which dissolves in a substitutional manner, with an excessively high composition ratio of element X', the antiferromagnetic properties deteriorate to decrease the exchange coupling magnetic field (Hex) produced at the interface with the pinned magnetic layer 3. In the present invention, particularly, a rare gas element of inert gas (at least one of Ne, Ar, Kr, and Xe) which dissolves in an interstitial manner is preferably used as the element X'. A rare gas element is an inert gas element, and thus has less effect on the antiferromagnetic properties even when the rare gas element is contained in a film. Furthermore, an Ar gas is conventionally introduced as a sputtering gas into a sputtering apparatus, and Ar can easily be entered into a film only by appropriately controlling a gas pressure.

When a gaseous element is used as the element X', it is difficult to mix a large amount of element X' in a film. However, in the use of a rare gas, the exchange coupling magnetic field (Hex) produced by a heat treatment can be significantly increased by entering only a small amount of rare gas into a film.

Although the PtMn alloy, X—Mn alloy or Pt—Mn—X' alloy has a disordered face-centered cubic structure (fcc) immediately after deposition, the fcc structure can be transformed into a CuAuI-type ordered face-centered tetragonal structure (fct) by a heat treatment to produce a great exchange coupling magnetic field at the interface with the pinned magnetic layer 3.

The Cr element used in the present invention is thought to functionally promote ordering transformation of the PtMn alloy, X—Mn alloy or Pt—Mn—X' alloy.

In a heat treatment of the antiferromagnetic layer 4 comprising the PtMn alloy, X—Mn alloy or Pt—Mn—X' alloy laminated on the pinned magnetic layer 3, the PtMn alloy, X—Mn alloy or Pt—Mn—X' alloy is transformed into the ordered structure. However, the vicinity of the interface between the antiferromagnetic layer 4 and the pinned magnetic layer 3 is less transformed into the ordered structure. When the Cr element is present near the interface between the antiferromagnetic layer 4 and the pinned magnetic layer 3, the vicinity of the interface is nearly completely transformed into the ordered structure as compared with a case in which the Cr element is absent. As a result, the exchange coupling magnetic field produced at the interface is possibly increased.

In the present invention, the antiferromagnetic layer 4 has, for example, a CuAuI-type crystal structure, and the lattice points of a crystal lattice composed of Pt and Mn, the lattice points of a crystal structure composed of the element X and Mn, or the lattice points of a crystal lattice composed of the elements Pt, Mn and X' are partially substituted by the Cr element.

In a composition of the antiferromagnetic layer 4 except the Cr element, the at % ratio of the element Pt, X or Pt+X' to Mn is preferably set in the range of 45:55 to 60:40, and more preferably in the range of 49:51 to 56.5:43.5. In this case, the interface with the pinned magnetic layer 3 is put into the incoherent state in the deposition step, and the antiferromagnetic layer 4 is possibly properly transformed into the ordered structure by a heat treatment.

In the composition except the Cr element, the at % (atomic %) ratio of element X' is preferably 0.2 to 10, and more preferably 0.5 to 5.

In the composition of the alloy constituting the antiferromagnetic layer 4, in order to suppress deterioration in the antiferromagnetic properties of the antiferromagnetic layer 4 due to mixing of the Cr element, it is effective that the at % (atomic %) ratio of each of elements except the Cr element is constant within the antiferromagnetic layer 4.

For example, when the antiferromagnetic layer 4 is composed of elements Pt, Mn and Cr, a PtMnCr alloy constituting the antiferromagnetic layer 4 is represented by the formula $(Pt_xMn_y)_aCr_b$ (wherein each of x and y is a constant of 0 to 1 and represents an at % ratio, x+y=1, a and b each represent an at % ratio, and a+b=100 at %).

The pinned magnetic layer 3 preferably has a laminated ferrimagnetic structure comprising a first magnetic layer 13 formed in contact with the antiferromagnetic layer 4, and a second magnetic layer 11 opposing the first magnetic layer 13 with a nonmagnetic intermediate layer 12 provided therebetween.

Each of the first and second magnetic layers 13 and 11 preferably comprises a CoFe alloy. In this case, a coupling magnetic field due to a RKKY interaction between the first and second magnetic layers 13 and 11 can be increased, thereby appropriately pinning the magnetization of the second magnetic layer 11.

The material for forming the first and second magnetic layers 13 and 11 is not limited to the CoFe alloy, and other magnetic materials such as a CoFeNi alloy, Co, a NiFe alloy, and the like may be used.

Since the pinned magnetic layer 3 has the laminated ferrimagnetic structure, a magnetic moment (saturation magnetization Ms×thickness t) per unit area of the first magnetic layer 13 must be differentiated from a magnetic moment per unit area of the second magnetic layer 11 in order to appropriately obtain a laminated ferrimagnetic state.

Consequently, the magnetizations of the first and second magnetic layers 13 and 11 can be properly made antiparallel to each other by the coupling magnetic field due to the RKKY interaction between the first and second magnetic layers 13 and 11.

Furthermore, the nonmagnetic intermediate layer 12 interposed between the first and second magnetic layers 13 and 11 preferably comprises an alloy composed of at least one element of Ru, Rh, Ir, Os, Re, and Cu. In the present invention, the nonmagnetic intermediate layer 12 more preferably comprises Ru. In this case, the coupling magnetic field due to a RKKY interaction between the first and second magnetic layers 13 and 11 can be increased, thereby appropriately bringing the magnetizations of the first and second magnetic layer 13 and 11 into an antiparallel state.

When the ferromagnetic layer 3 has the laminated ferrimagnetic structure, the first magnetic layer 13 preferably has a region B1 containing the Cr element near the interface S with the antiferromagnetic layer 4, and a region B2 not containing the Cr element near the interface with the nonmagnetic intermediate layer 12.

When the region B2 not containing the Cr element is present near the interface with the nonmagnetic intermediate layer 12, the coupling magnetic field due to the RKKY interaction between the first and second magnetic layers 13 and 11 through the nonmagnetic intermediate layer 12 is higher than that in a case in which the region B1 containing the Cr element is formed in contact with the nonmagnetic intermediate layer 12.

Therefore, the exchange coupling magnetic field (Hex) produced between the first magnetic layer 13 and the antiferromagnetic layer 4 can be increased, and the coupling magnetic field due to the RKKY interaction can be increased, thereby increasing a one-directional exchange bias magnetic field (Hex*) in the pinned magnetic layer 3 as compared with a conventional exchange coupling film.

The Cr element content at the interface between the first magnetic layer 13 and the antiferromagnetic layer 4 may be higher than that at the interface with the nonmagnetic intermediate layer 12 In this case, a one-directional exchange bias magnetic field (Hex*) in the pinned magnetic layer 3 can be increased, as compared with a conventional exchange coupling film.

However, in order to increase the coupling magnetic field due to the RKKY interaction produced between the first and second magnetic layers 13 and 11 through the nonmagnetic intermediate layer 12, the region B2 not containing the Cr element is preferably present near the interface with the nonmagnetic intermediate layer 12.

In the magnetic detecting element according to the embodiment of the present invention shown in FIG. 1, even when the track width dimensions of the antiferromagnetic layer 4 and the pinned magnetic layer 3, and the thickness dimension and the height dimension of the antiferromagnetic layer 4 are decreased for further narrowing the track width and the gap of the magnetic detecting element, the magnetization direction of the pinned magnetic layer 3 can be securely pinned in a direction.

Namely, in the present invention, the crossing angle between the magnetization directions of the pinned magnetic layer 3 and the free magnetic layer 1 can easily be kept constant, thereby decreasing a degree of asymmetry of an output signal waveform.

Also, the one-directional exchange bias magnetic field (Hex*) can be increased to improve an ESD resistance and an electromigration resistance which are representative of communication reliability.

The structures of the pinned magnetic layer 3 and the antiferromagnetic layer 4 described in detail above with reference to FIG. 1 can be applied to magnetic detecting elements having other structures.

Figure 2:
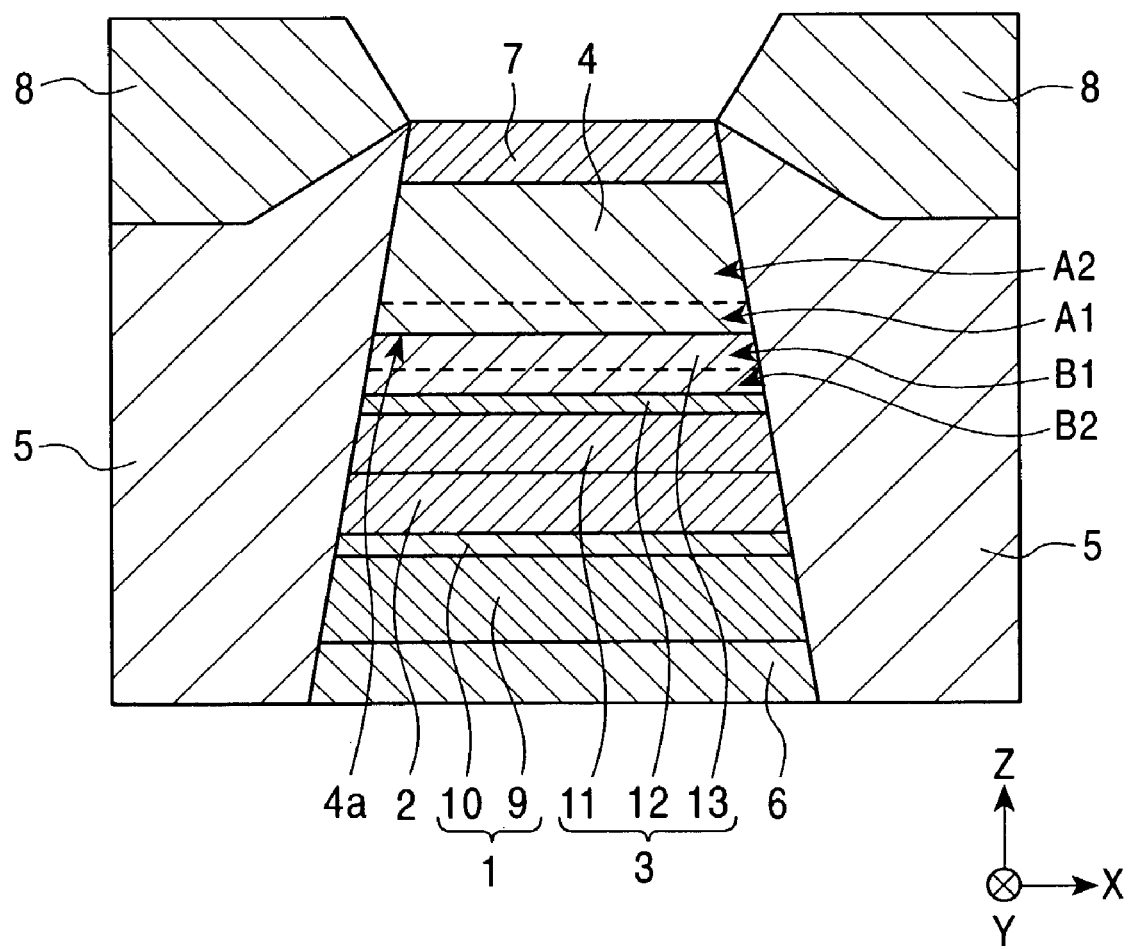
FIG. 2 is a sectional view of a structure of a magnetic detecting element (single spin-valve magnetoresistive element) according to a second embodiment of the present invention, as viewed from a side facing a recording medium.

FIG. 2 is a partial sectional view of a magnetic detecting element (single spin-valve thin film element) according to another embodiment, as viewed from a side facing a recording medium in FIG. 2, the layers denoted by the same reference numerals as FIG. 1 are the same layers as FIG. 1.

In FIG. 2, the free magnetic layer 1 is formed below the antiferromagnetic layer 4. Namely, the laminated structure shown in FIG. 2 is reverse to the laminated structure shown in FIG. 1.

In this embodiment, the antiferromagnetic layer 4 and the pinned magnetic layer 3 constitute an exchange coupling film of the present invention.

Namely, the antiferromagnetic 4 has a region A1 containing a Cr element with a concentration gradient in the thickness direction (the Z direction shown in the drawing), and the pinned magnetic layer 3 comprising a ferromagnetic layer of the exchange coupling film of the present invention has a region B1 containing a Cr element with a concentration gradient in the thickness direction (the Z direction shown in the drawing).

When the antiferromagnetic layer 4 and the pinned magnetic layer 3 respectively have the regions A1 and B1 each containing the Cr element, the exchange coupling magnetic field produced between the antiferromagnetic layer 4 and the pinned magnetic layer 3 is higher than that in a case in which the Cr element is not contained.

In the magnetic detecting element shown in FIG. 2, the Cr element is present near the interface between the antiferromagnetic layer 4 and the pinned magnetic layer 3, and thus the exchange coupling magnetic field (Hex) produced between the antiferromagnetic layer 4 and the pinned magnetic layer 3 can be effectively increased.

However, when a Cr element is mixed over the entire region of an antiferromagnetic material, antiferromagnetic properties tend to deteriorate. In this embodiment, therefore, the antiferromagnetic layer 4 has a region A2 not containing the Cr element in order to suppress deterioration in the antiferromagnetic properties.

The pinned magnetic layer 3 has a laminated ferrimagnetic structure comprising a first magnetic layer 13 formed in contact with the antiferromagnetic layer 4, and a second magnetic layer 11 opposing the first magnetic layer 13 with a nonmagnetic intermediate layer 12 provided therebetween.

With the pinned magnetic layer 3 having the laminated ferrimagnetic structure, the first magnetic layer 13 preferably has a region B1 containing a Cr element near the interface with the antiferromagnetic layer 4, and a region B2 not containing the Cr element near the interface with the nonmagnetic intermediate layer 12.

When the region B2 not containing the Cr element is present near the interface with the nonmagnetic intermediate layer 12, the coupling magnetic field due to the RKKY interaction between the first and second magnetic layers 13 and 11 through the nonmagnetic intermediate layer 12 is higher than that in a case in which the region B1 containing the Cr element is formed in contact with the nonmagnetic intermediate layer 12.

Therefore, the exchange coupling magnetic field (Hex) produced between the first magnetic layer 13 and the antiferromagnetic layer 4 can be increased, and the coupling magnetic field due to the RKKY interaction can be increased, thereby increasing a one-directional exchange bias magnetic field (Hex*) in the pinned magnetic layer 3 as compared with a conventional exchange coupling film.

The Cr element content at the interface between the first magnetic layer 13 and the antiferromagnetic layer 4 may be higher than that at the interface with the nonmagnetic intermediate layer 12. In this case, a one-directional exchange bias magnetic field (Hex*) in the pinned magnetic layer 3 can be increased, as compared with a conventional exchange coupling film.

However, in order to increase the coupling magnetic field due to the RKKY interaction produced between the first and second magnetic layers 13 and 11 through the nonmagnetic intermediate layer 12, the region B2 not containing the Cr element is preferably present near the interface with the nonmagnetic intermediate layer 12.

In the magnetic detecting element according to the embodiment of the present invention shown in FIG. 2, even when the track width dimensions of the antiferromagnetic layer 4 and the pinned magnetic layer 3, and the thickness dimension and the height dimension of the antiferromagnetic layer 4 are decreased for further narrowing the track width and the gap of the magnetic detecting element, the magnetization direction of the pinned magnetic layer 3 can be securely pinned in a direction.

Namely, in the present invention, the crossing angle between the magnetization directions of the pinned magnetic layer 3 and the free magnetic layer 1 can easily be kept constant, thereby decreasing a degree of asymmetry of an output signal waveform.

Also, the one-directional exchange bias magnetic field (Hex*) can be increased to improve ESD resistance and electromigration resistance which are representative of communication reliability.

The material and composition ratio of each of the layers including the pinned magnetic layer 3, the antiferromagnetic layer 4, etc. are the same as described above with reference to FIG. 1.

When the magnetic detecting element shown in FIG. 2 is used as a tunneling magnetoresistive element or CPP magnetic detecting element, the electrode layers 8 are respectively formed blow the free magnetic layer 1 and above the antiferromagnetic layer 4.

Figure 3:
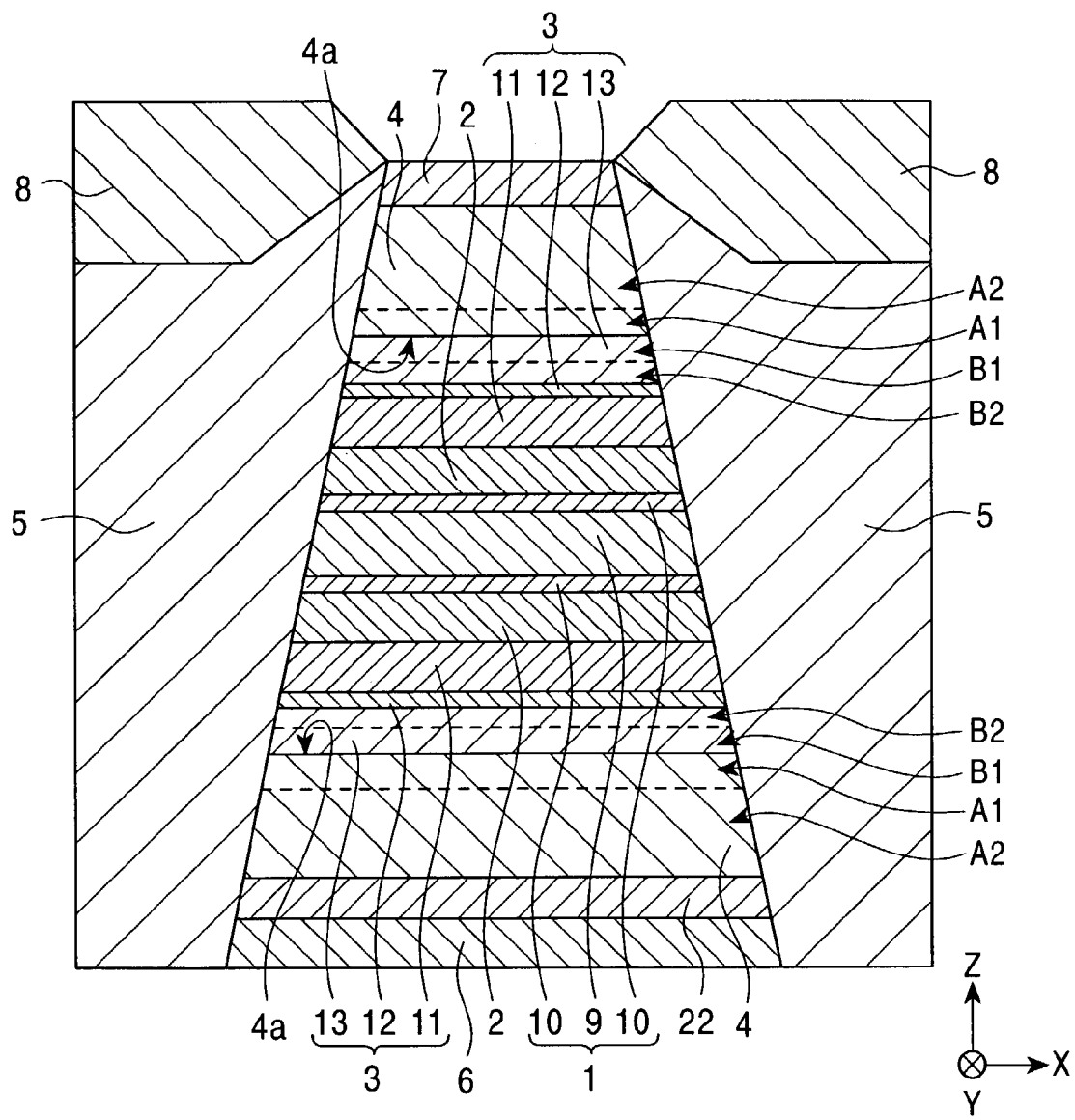
FIG. 3 is a sectional view of a structure of a magnetic detecting element (dual spin-valve magnetoresistive element) according to a third embodiment of the present invention, as viewed from a side facing a recording medium.

FIG. 3 is a partial sectional view of a structure of a magnetic detecting element (dual spin-valve thin film element) according to still another embodiment, as viewed from a side facing a recording medium.

As shown in FIG. 3, an underlying layer 6, a seed layer 22, an antiferromagnetic layer 4, a pinned magnetic layer 3, a nonmagnetic material layer 2, and a free magnetic layer 1 are continuously laminated from below. The free magnetic layer 1 comprises three films including, for example, two CoFe alloy films 10 and a NiFe alloy film 9. Furthermore, a nonmagnetic material layer 2, a pinned magnetic layer 3, an antiferromagnetic layer 4, and a protective layer 7 are continuously laminated on the free magnetic layer 1.

Furthermore, hard bias layers 5 and electrode layers 8 are formed on both sides of a multilayer film ranging from the underlying layer 6 to the protective layer 7. The material of each of the layers is the same as described above with reference to FIGS. 1 and 2.

In this embodiment, each pair of the antiferromagnetic layer 4 and the pinned magnetic layer 3 constitutes an exchange coupling film of the present invention.

Namely, each of the antiferromagnetic layers 4 has a region A1 containing a Cr element with a concentration gradient in the thickness direction (the Z direction shown in the drawing), and each of the pinned magnetic layers 3 each comprising a ferromagnetic layer of the exchange coupling film of the present invention has a region B1 containing a Cr element with a concentration gradient in the thickness direction (the Z direction shown in the drawing).

When the antiferromagnetic layer 4 and the pinned magnetic layer 3 in each exchange coupling film respectively have the regions A1 and B1 each containing the Cr element, the exchange coupling magnetic field produced between the antiferromagnetic layer 4 and the pinned magnetic layer 3 is higher than that in a case in which the Cr element is not contained.

In the magnetic detecting element shown in FIG. 3, the Cr element is present near the interface between the antiferromagnetic layer 4 and the pinned magnetic layer 3 in each exchange coupling film, and thus the exchange coupling magnetic field (Hex) produced between the antiferromagnetic layer 4 and the pinned magnetic layer 3 can be effectively increased.

However, when a Cr element is mixed over the entire region of an antiferromagnetic material, antiferromagnetic properties tend to deteriorate. In this embodiment, therefore, each of the antiferromagnetic layers 4 has a region A2 not containing the Cr element in order to suppress deterioration in the antiferromagnetic properties.

Each of the pinned magnetic layers 3 has a laminated ferrimagnetic structure comprising a first magnetic layer 13 formed in contact with the antiferromagnetic layer 4, and a second magnetic layer 11 opposing the first magnetic layer 13 with a nonmagnetic intermediate layer 12 provided therebetween.

With the pinned magnetic layers 3 each having the laminated ferrimagnetic structure, the first magnetic layer 13 of each pinned magnetic layer 13 preferably has a region B1 containing the Cr element near the interface with the antiferromagnetic layer 4, and a region B2 not containing the Cr element near the interface with the nonmagnetic intermediate layer 12.

When the region B2 not containing the Cr element is present near the interface with each of the nonmagnetic intermediate layers 12, the coupling magnetic field due to the RKKY interaction between the first and second magnetic layers 13 and 11 through the nonmagnetic intermediate layer 12 is higher than that in a case in which the region B1 containing the Cr element is formed in contact with the nonmagnetic intermediate layer 12.

Therefore, in each exchange coupling film, the exchange coupling magnetic field (Hex) produced between the first magnetic layer 13 of the pinned magnetic layer 3 and the antiferromagnetic layer 4 can be increased, and the coupling magnetic field due to the RKKY interaction can be increased, thereby increasing a one-directional exchange bias magnetic field (Hex*) in each of the pinned magnetic layers 3 as compared with a conventional exchange coupling film.

In each coupling magnetic film, the Cr element content at the interface between the first magnetic layers 13 and the antiferromagnetic layer 4 may be higher than that at the interface with the nonmagnetic intermediate layer 12. In this case, a one-directional exchange bias magnetic field (Hex*) in the pinned magnetic layer 3 can be increased, as compared with a conventional exchange coupling film.

However, in order to increase the coupling magnetic field due to the RKKY interaction produced between the first and second magnetic layers 13 and 11 through the nonmagnetic intermediate layer 12 in each of the pinned magnetic layers 3, the region B2 not containing the Cr element is preferably present near the interface with the nonmagnetic intermediate layer 12.

In the magnetic detecting element shown in FIG. 3, even when the track width dimension of each of the antiferromagnetic layers 4 and the pinned magnetic layers 3, and the thickness dimension and the height dimension of each of the antiferromagnetic layers 4 are decreased for further narrowing the track width and the gap of the magnetic detecting element, the magnetization direction of each of the pinned magnetic layers 3 can be securely pinned in a direction.

Namely, in the present invention, the crossing angle between the magnetization directions of each of the pinned magnetic layers 3 and the free magnetic layer 1 can easily be kept constant, thereby decreasing a degree of asymmetry of an output signal waveform.

Also, the one-directional exchange bias magnetic field (Hex*) can be increased to improve ESD resistance and electromigration resistance which are representative of communication reliability.

The material and composition ratio of each of the layers including the pinned magnetic layer 3, the antiferromagnetic layer 4, etc. are the same as described above with reference to FIG. 1.

When the magnetic detecting element shown in FIG. 3 is used as a tunneling magnetoresistive element or CPP magnetic detecting element, the electrode layers 8 are respectively formed above the upper antiferromagnetic layer 4 and below the lower antiferromagnetic layer 4.

In each of the magnetic detecting elements shown in FIGS. 1 to 3, the pinned magnetic layer 3 has the laminated ferrimagnetic structure comprising the first magnetic layer 13, the nonmagnetic intermediate layer 12, and the second magnetic layer 11. However, the pinned magnetic layer 3 is not limited to the laminated ferrimagnetic structure. Even when the pinned magnetic layer 3 comprises a single layer or two or more ferromagnetic layers, a Cr element is present near the interface between the antiferromagnetic layer 4 and the pinned magnetic layer 3, thereby achieving the effect of effectively increasing the exchange coupling magnetic field (Hex) produced between the antiferromagnetic layer 4 and the pinned magnetic layer 3.

In each of the magnetic detecting elements shown in FIGS. 1 to 3, the hard bias layers 5 are used for aligning the magnetization direction of the free magnetic layer 1. However, exchange bias layers each comprising an antiferromagnetic material may be formed to be magnetically connected to both ends of the free magnetic layer 1 in the track width direction, so that the magnetization of the free magnetic layer 1 is aligned in a direction crossing the magnetization of the pinned magnetic layer 3. In this case, the free magnetic layer 1 and each exchange bias layer may be formed in an exchange coupling film comprising an antiferromagnetic layer and a pinned magnetic layer of the present invention.

Figure 4:
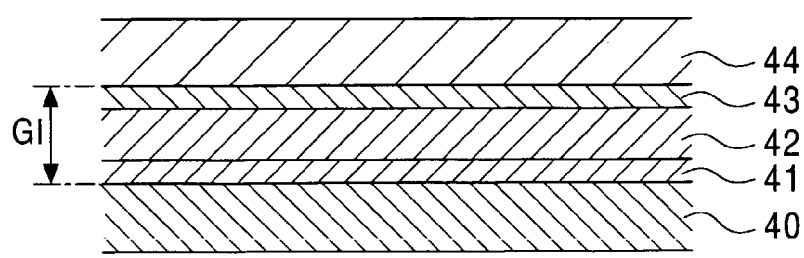
FIG. 4 is a partial sectional view of a chin film magnetic head comprising a magnetic detecting element.

FIG. 4 is a sectional view showing a structure of a reading head comprising any one of the magnetic detecting elements shown in FIGS. 1 to 3, as viewed from a side facing a recording medium.

In FIG. 4, reference numeral 40 denotes a lower shield layer made of, for example, a NiFe alloy. Also, a lower gap layer 41 is formed on the lower shield layer 40, and any one of the magnetic detecting elements 42 shown in FIGS. 1 to 3 is formed on the lower gap layer 41. Furthermore, an upper gap layer 43 is formed on the magnetic detecting element 42, and an upper shield layer 44 made of a NiFe alloy or the like is formed on the upper gap layer 43.

Each of the lower gap layer 41 and the upper gap layer 43 is made of an insulating material such as $SiO_2$, $Al_2O_3$ (alumina), or the like. As shown in FIG. 4, the length from the bottom of the lower gap layer 41 to the top of the upper gap layer 43 corresponds to a gap length G1. Decreasing the gap length G1 makes it possible to comply with a higher recording density.

In the present invention, even when the thickness of the antiferromagnetic layer 4 is decreased, a great exchange coupling magnetic field (Hex) can be produced. The thickness of the antiferromagnetic layer 4 can be sufficiently decreased to, for example, 70 Å, as compared with a conventional antiferromagnetic layer having a thickness of amount 300 Å. In the present invention, a great exchange coupling magnetic field (Hex) can be obtained due to the presence of the Cr element near the interface between the antiferromagnetic layer 4 and the pinned magnetic layer 3. Therefore, even when the thickness of the antiferromagnetic layer 4 is decreased, a great exchange coupling magnetic field (Hex) can be sufficiently obtained.

It is thus possible to produce a thin film magnetic head in which a gap can be narrowed to permit application to a higher recording density.

In addition, a writing inductive head may be formed on the upper shield layer 44.

The magnetic detecting element of the present invention can be applied to a magnetic sensor other than a magnetic head to be incorporated into a hard disk device.

Description will now be made of a method of producing a magnetic detecting element using a method of producing an exchange coupling film according to an embodiment of the present invention with reference to FIG. 5.

First, an underlying layer 6 is formed on a substrate not shown in the drawing. The underlying layer 6 is preferably composed of at least one element of Ta, Hf, Nb, Zr, Ti, Mo, and W. Next, a seed layer 22 is deposited on the underlying layer 6 by sputtering. In sputtering deposition, a target composed of NiFeCr or Cr is prepared. The seed layer 22 is formed to a thickness of, for example, about 20 Å to 60 Å by sputtering. When the seed layer 22 is composed of NiFeCr, the composition ratio is substantially $(Ni_{0.8}Fe_{0.2})_{60at\%}Cr_{40at\%}$.

Next, an antiferromagnetic layer 4 is deposited on the seed layer 22 by sputtering.

In the present invention, the antiferromagnetic layer 4 is preferably deposited by sputtering an antiferromagnetic material containing element X (X is at least one element of Pt, Pd, Ir, Rh, Ru, and Os) and Mn.

In the present invention, the antiferromagnetic layer 4 may be deposited by sputtering a X—Mn—X' alloy (wherein element X' is at least one of Ne, Ar, Kr, Xe, Be, B, C, N, Mg, Al, Si, P, Ti, V, Fe, Co, Ni, Cu, Zn, Ga, Ge, Zr, Nb, Mo, Ag, Cd, Ir, Sn, Hf, Ta, W, Re, Au, Pb, and the rare earth elements).

In the present invention, the composition ratio of element X or element X+X' is preferably 45 at % to 60 at %.

Furthermore, a Cr element layer 50 composed of Cr (chromium) is deposited on the antiferromagnetic layer 4 by sputtering, and a pinned magnetic layer 3 is deposited on the Cr element layer 50 by sputtering.

In this embodiment, the average thickness of the Cr element layer 50 is preferably 0.1 Å to 1.65 Å, more preferably 0.1 Å to 1.0 Å, and most preferably 0.1 Å to 0.5 Å.

The average thickness of the Cr element layer 50 can be measured by using a fluorescent X-ray spectroscopic analyzer.

In the present invention, the average thickness of the Cr element layer 50 may be less than 1 Å. As is generally known, a thickness of 1 Å corresponds to the diameter of one atom or less, and there is thus no uniform thin film of less than 1 Å thick. However, a thin film containing Cr atoms nonuniformely present, i.e., sparsely present, has a region containing Cr, and a region not containing Cr. As a result, when the average thickness of the Cr element layer is defined as described above, the average thickness of the Cr element layer 50 is less than 1 Å in some cases.

The pinned magnetic layer 3 is formed in a laminated ferrimagnetic structure comprising a first magnetic layer 13 and a second magnetic layer 11 formed on the first magnetic layer 13 with a nonmagnetic intermediate layer 12 provided therebetween.

Each of the first and second magnetic layers 13 and 11 may be made of a CoFe alloy, a CoFeNi alloy, Co or a NiFe alloy. The nonmagnetic intermediate layer 12 is preferably made of an alloy composed of at least one element of Ru, Rh, Ir, Os, Re, and Cu.

Next, a nonmagnetic material layer 2 composed of Cu or the like, a free magnetic layer 1 comprising, for example, a CoFe alloy film 10 and a NiFe alloy film 9, a backed layer 15 composed of, for example, Cu or the like, and a protective layer 7 (which may be a specular reflection layer comprising, for example, a Ta oxide) are deposited on the second magnetic layer 11 by sputtering.

Figure 5:
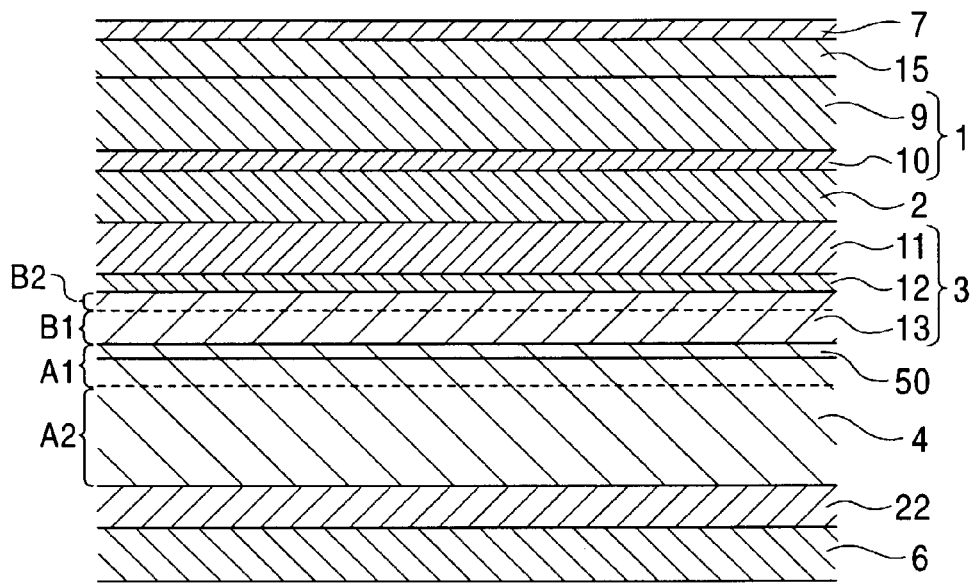
FIG. 5 is a schematic drawing illustrating a step of a method of producing an exchange coupling film and a magnetic detecting element according to the present invention.

FIG. 5 shows a state in which the underlying layer 6, the seed layer 22, the antiferromagnetic layer 4, the Cr element layer SO, the pinned magnetic layer 3, the nonmagnetic material layer 2, the free magnetic layer 1, the backed layer IS and the protective layer 7 are deposited.

Next, a heat treatment is performed. In the heat treatment, the temperature is 290° C., and the retention time is 4 hours. The antiferromagnetic layer 4 is preferably made of the above-described X—Mn alloy or X—Mn—X' alloy. However, in the use of such an antiferromagnetic material, an exchange coupling magnetic field (Hex) is not produced at the interface with the pinned magnetic layer 3 without a heat treatment. Therefore, in the present invention, an exchange coupling magnetic field (Hex) can be produced by a heat treatment at the interface between the antiferromagnetic layer 4 and the first magnetic layer 13 of the pinned magnetic layer 3. During this heat treatment, a magnetic field of, for example, 800 (kA/m) is applied in parallel with the Y direction to pin the magnetization of the pinned magnetic layer 3 in a direction parallel to the Y direction. In the present invention, the pinned magnetic layer 3 has the laminated ferrimagnetic structure, and thus the magnetizations of the first and second magnetic layers 13 and 11 are antiparallel to each other.

After the heat treatment, the central portion of the protective layer 7 is masked with photoresist, and the underlying layer 6, the seed layer 22, the antiferromagnetic layer 4, the Cr element layer 10, the pinned magnetic layer 3, the nonmagnetic material layer 2, the free magnetic layer 1, and the backed layer 15 are removed from an unmasked portion by ion milling or the like. Then, hard bias layers 5 and electrode layers 8 are deposited, and the photoresist is then removed to obtain the magnetic detecting element shown in FIG. 1.

By performing the heat treatment, a great exchange coupling magnetic field (Hex) can be produced between the first magnetic layer 13 and the antiferromagnetic layer 4.

Also, in the heat treatment, the Cr element constituting the Cr element layer 50 thermally diffuses to mix in the first magnetic layer 13 of the pinned magnetic layer 3 and the antiferromagnetic layer 4.

Therefore, the Cr element layer 50 having the interfaces with the first magnetic layer 13 and the antiferromagnetic layer 4 as shown in FIG. 5 disappears after the heat treatment. As a result, the content of the Cr element has a maximum at the interfaces with the antiferromagnetic layer 4 and the pinned magnetic layer 3, and gradually decreases away from the interfaces.

Consequently, like in the magnetic detecting element shown in FIG. 1, the antiferromagnetic layer 4 has a region A1 containing a Cr element with a concentration gradient in the thickness direction (the Z direction shown in the drawing), and the first magnetic layer 13 of the pinned magnetic layer 3 has a region B1 containing the Cr element with a concentration gradient in the thickness direction (the Z direction shown in the drawing).

When the antiferromagnetic layer 4 and the pinned magnetic layer 3 respectively have the regions A1 and B1 each containing the Cr element, the exchange coupling magnetic field produced between the antiferromagnetic layer 4 and the pinned magnetic layer 3 is higher than that in a case in which the Cr element is not contained.

However, when a Cr element is mixed over the entire region of an antiferromagnetic material, antiferromagnetic properties tend to deteriorate. In this embodiment, therefore, the Cr element layer 50 is formed to such a small thickness as described above so that the antiferromagnetic layer 4 has a region A2 not containing the Cr element, for suppressing deterioration in the antiferromagnetic properties.

With the pinned magnetic layer 3 having the laminated ferrimagnetic structure, the first magnetic layer 13 preferably has a region B2 not containing the Cr element near the interface with the nonmagnetic intermediate layer 12.

When the region B2 not containing the Cr element is present near the interface with the nonmagnetic intermediate layer 12, the coupling magnetic field due to the RKKY interaction between the first and second magnetic layers 13 and 11 through the nonmagnetic intermediate layer 12 is higher than that in a case in which the region B1 containing the Cr element is formed in contact with the nonmagnetic intermediate layer 12. In this embodiment, the Cr element layer 50 is formed to such a small thickness as described above to form the region B2 not containing the Cr element.

Therefore, the exchange coupling magnetic field (Hex) produced between the first magnetic layer 13 and the antiferromagnetic layer 4 can be increased, and the coupling magnetic field due to the RKKY interaction can be increased, thereby increasing a one-directional exchange bias magnetic field (Hex*) in the pinned magnetic layer 3 as compared with a conventional exchange coupling film.

Alternatively, the Cr element may be present at the interface between the first magnetic layer 13 and the nonmagnetic intermediate layer 12, and the Cr element content at the interface between the first magnetic layer 13 and the antiferromagnetic layer 4 may be higher than that at the interface with the nonmagnetic intermediate layer 12. In this case, a one-directional exchange bias magnetic field (Hex*)

in the pinned magnetic layer 3 can be increased, as compared with a conventional exchange coupling film.

However, in order to increase the coupling magnetic field due to the RKKY interaction produced between the first and second magnetic layers 13 and 11 through the nonmagnetic intermediate layer 12, the region B2 not containing the Cr element is preferably present near the interface with the nonmagnetic intermediate layer 12.

Figure 11:
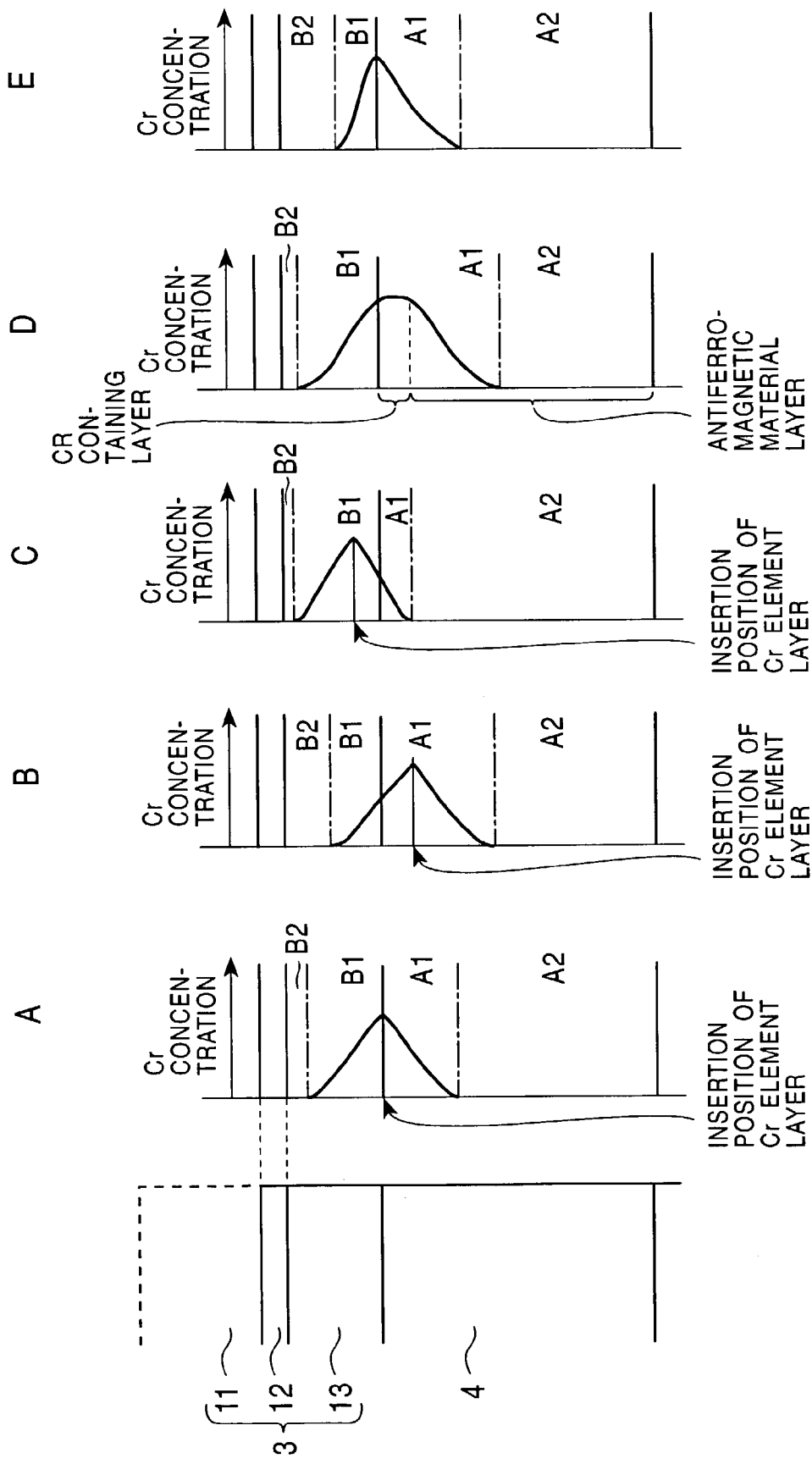
FIG. 11 is a schematic drawing illustrating a Cr concentration gradient in a pinned magnetic layer and an antiferromagnetic layer (exchange coupling film) of a magnetic detecting element according to the present invention.

FIG. 11A schematically shows the Cr element concentration gradients in the pinned magnetic layer 3 and the antiferromagnetic layer 4 after the heat treatment. The Cr element concentration gradients in the regions A1 and B1 are symmetrical with respect to the interface between the pinned magnetic layer 3 and the antiferromagnetic layer 4.

A method of producing an exchange coupling film according to another embodiment of the present invention will be described below with reference to FIG. 6.

An underlying layer 6 and a seed layer 22 are deposited in the same manner as the embodiment shown in FIG. 5.

Figure 6:
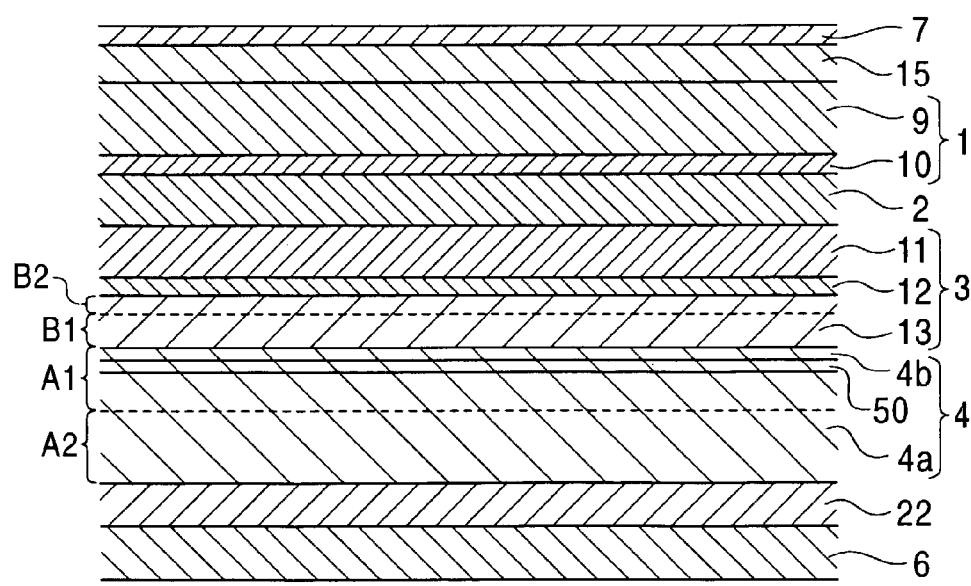
FIG. 6 is a schematic drawing illustrating a step of a method of producing an exchange coupling film and a magnetic detecting element according to the present invention.

As shown in FIG. 6, a first antiferromagnetic layer 4a, a Cr element layer 50, a second antiferromagnetic layer 4b are deposited on the seed layer 22 by sputtering to form an antiferromagnetic layer 4. Each of the first and second antiferromagnetic layers 4a and 4b is made of an antiferromagnetic material containing element X (X is at least one element of Pt, Pd, Ir, Rh, Ru, and Os) and Mn. Each of the antiferromagnetic layers 4a and 4b may be made of a X—Mn—X' alloy (wherein element X' is at least one of Ne, Ar, Kr, Xe, Be, B, C, N, Mg, Al, Si, P, Ti, V, Fe, Co, Ni, Cu, Zn, Ga, Ge, Zr, Nb, Mo, Ag, Cd, Ir, Sn, Hf, Ta, W, Re, Au, Pb, and the rare earth elements).

In the present invention, the composition ratio of element X or element X+X' is preferably 45 at % to 60 at %.

In this embodiment, the average thickness of the Cr element layer 50 is preferably 0.1 Å to 2.0 Å, more preferably 0.1 Å to 1.0 Å, and most preferably 0.1 Å to 0.5 Å.

Assuming that the average thickness of the Cr element layer 50 is x Å, the second antiferromagnetic layer 4b is formed to a thickness of (2−x/2) Å to (20−x/2) Å so that the Cr element layer 50 can be deposited at a distance of 2 Å to 20 Å from the interface between the pinned magnetic layer 3 and the antiferromagnetic layer 4.

In the present invention, the pinned magnetic layer 3 is formed in a laminated ferrimagnetic structure comprising a first magnetic layer 13, and a second magnetic layer 11 formed on the first magnetic layer 13 with a nonmagnetic intermediate layer 12 provided therebetween.

Each of the first and second magnetic layers 13 and 11 may be made of a CoFe alloy, a CoFeNi alloy, Co or a NiFe alloy. The nonmagnetic intermediate layer 12 is preferably made of an alloy composed of at least one element of Ru, Rh, Ir, Os, Re, and Cu.

Next, a nonmagnetic material layer 2 composed of Cu or the like, a free magnetic layer 1 comprising two films, for example, a CoFe alloy film 10 and a NiFe alloy film 9, a backed layer 15 composed of Cu or the like, and a protective layer 7 (which may be a specular reflection layer comprising, for example, a Ta oxide) are deposited on the second magnetic layer 11 by sputtering.

Furthermore, a heat treatment is performed at 290° C. for 4 hours in a magnetic field of 800 kA/m, and then the central portion of the protective layer 7 is masked with photoresist. Then, the underlying layer 6, the seed layer 22, the antiferromagnetic layer 4, the Cr element layer 50, the pinned magnetic layer 3, the nonmagnetic material layer 2, the free magnetic layer 1, and the backed layer 15 are removed from an unmasked portion by ion milling or the like. Then, hard bias layers 5 and electrode layers 8 are deposited, and the photoresist is then removed to obtain the magnetic detecting element shown in FIG. 1.

In this embodiment, by performing the heat treatment, a great exchange coupling magnetic field (Hex) can be produced between the first magnetic layer 13 and the antiferromagnetic layer 4.

Also, in the heat treatment, the Cr element constituting the Cr element layer 50 thermally diffuses to mix in the first magnetic layer 13 of the pinned magnetic layer 3 and the antiferromagnetic layer 4.

Therefore, the Cr element layer 50 having the interfaces within the antiferromagnetic layer 4 as shown in FIG. 6 disappears after the heat treatment. As a result, the content of the Cr element has a maximum in a predetermined region of the antiferromagnetic layer 4, and gradually decreases away from the predetermined region. In this embodiment, the region having the maximum Cr element content corresponds to the region in which the Cr element layer 50 is formed before the heat treatment, and is at a distance of 2 Å to 20 Å from the interface between the pinned magnetic layer 3 and the antiferromagnetic layer 4.

Consequently, like in the magnetic detecting element shown in FIG. 1, the antiferromagnetic layer 4 has a region A1 containing the Cr element with a concentration gradient in the thickness direction (the Z direction shown in the drawing), and the first magnetic layer 13 of the pinned magnetic layer 3 has a region B1 containing the Cr element with a concentration gradient in the thickness direction (the Z direction shown in the drawing).

When the antiferromagnetic layer 4 and the pinned magnetic layer 3 respectively have the regions A1 and B1 each containing the Cr element, the exchange coupling magnetic field (Hex) produced between the antiferromagnetic layer 4 and the pinned magnetic layer 3 is higher than that in a case in which the Cr element is not contained.

However, when a Cr element is mixed over the entire region of an antiferromagnetic material, antiferromagnetic properties tend to deteriorate. In this embodiment, therefore, the Cr element layer 50 is formed to such a small thickness as described above so that the antiferromagnetic layer 4 has a region A2 not containing the Cr element, for suppressing deterioration in the antiferromagnetic properties.

With the pinned magnetic layer 3 having the laminated ferrimagnetic structure, the first magnetic layer 13 preferably has a region B2 not containing the Cr element near the interface with the nonmagnetic intermediate layer 12, thereby increasing the coupling magnetic field due to the RKKY interaction between the first and second magnetic layers 13 and 11 through the nonmagnetic intermediate layer 12.

Therefore, the exchange coupling magnetic field (Hex) produced between the first magnetic layer 13 and the antiferromagnetic layer 4 can be increased, and the coupling magnetic field due to the RKKY interaction can be increased, thereby increasing a one-directional exchange bias magnetic field (Hex*) in the pinned magnetic layer 3 as compared with a conventional exchange coupling film.

FIG. 11B schematically shows the Cr element concentration gradients in the pinned magnetic layer 3 and the antiferromagnetic layer 4 after the heat treatment in this embodiment. The Cr element concentration gradients in the regions A1 and B1 are symmetrical with respect to the insertion position of the Cr element layer 50 in the antiferromagnetic layer 4. Therefore, the Cr element content in the antiferromagnetic layer 4 is higher than that in the first magnetic layer 13 of the pinned magnetic layer 3.

A method of producing an exchange coupling film according to still another embodiment of the present invention will be described below with reference to FIG. 7.

An underlying layer 6, a seed layer 22 and an antiferromagnetic layer 4 are deposited in the same manner as the embodiment shown in FIG. 5.

Figure 7:
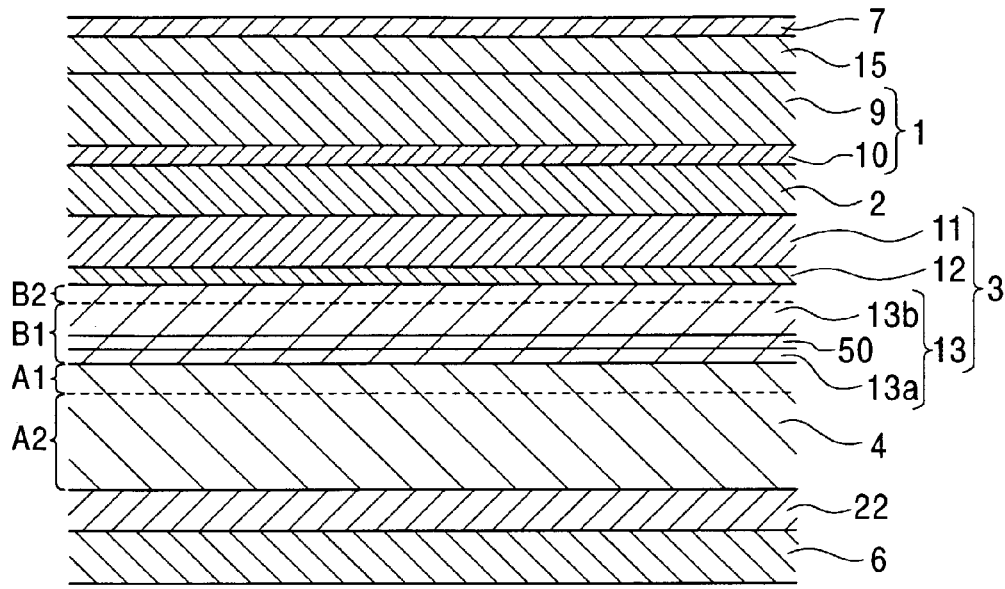
FIG. 7 is a schematic drawing illustrating a step of a method of producing an exchange coupling film and a magnetic detecting element according to the present invention.

As shown in FIG. 7, a first ferromagnetic layer 13a, a Cr element layer 50 and a second ferromagnetic layer 13b are deposited on the antiferromagnetic layer 4 by sputtering to form a first magnetic layer 13 of a pinned magnetic layer 3 comprising a ferromagnetic layer of the present invention. The pinned magnetic layer 3 has a laminated ferrimagnetic structure comprising the first magnetic layer 13, a nonmagnetic intermediate layer 12 and a second magnetic layer 11.

Each of the first and second ferromagnetic layers 13a and 13b, and the second magnetic layer 11 may be made of a CoFe alloy, a CoFeNi alloy, Co or a NiFe alloy. The nonmagnetic intermediate layer 12 is preferably made of an alloy composed of at least one element of Ru, Rh, Ir, Os, Re, and Cu.

In this embodiment, the average thickness of the Cr element layer 50 is preferably 0.1 Å to 2.0 Å, more preferably 0.1 Å to 1.0 Å, and most preferably 0.1 Å to 0.5 Å.

Next, a nonmagnetic material layer 2 composed of Cu or the like, a free magnetic layer 1 comprising two films, for example, a CoFe alloy film 10 and a NiFe alloy film 9, a backed layer 15 composed of Cu or the like, and a protective layer 7 (which may be a specular reflection layer comprising, for example, a Ta oxide) are deposited on the second magnetic layer 11 by sputtering.

Furthermore, a heat treatment is performed at 290° C. for 4 hours in a magnetic field of 800 kA/m, and then the central portion of the protective layer 7 is masked with photoresist. Then, the underlying layer 6, the seed layer 22, the antiferromagnetic layer 4, the Cr element layer 50, the pinned magnetic layer 3, the nonmagnetic material layer 2, the free magnetic layer 1, and the backed layer 15 are removed from an unmasked portion by ion milling or the like. Then, hard bias layers 5 and electrode layers 8 are deposited, and the photoresist is then removed to obtain the magnetic detecting element shown in FIG. 1.

In this embodiment, by performing the heat treatment, a great exchange coupling magnetic field (Hex) can be produced between the first magnetic layer 13 and the antiferromagnetic layer 4.

Also, in the heat treatment, the Cr element constituting the Cr element layer 50 thermally diffuses to mix in the first magnetic layer 13 of the pinned magnetic layer 3 and the antiferromagnetic layer 4.

Therefore, the Cr element layer 50 having interfaces within the first magnetic layer 13 as shown in FIG. 7 disappears after the heat treatment. As a result, the content of the Cr element has a maximum in a predetermined region of the first magnetic layer 13, and gradually decreases away from the predetermined region. In this embodiment, the region having the maximum Cr element content corresponds to the region in which the Cr element layer 50 is formed before the heat treatment.

Consequently, like in the magnetic detecting element shown in FIG. 1, the antiferromagnetic layer 4 has a region A1 containing the Cr element with a concentration gradient in the thickness direction (the Z direction shown in the drawing), and the first magnetic layer 13 of the pinned magnetic layer 3 has a region B1 containing the Cr element with a concentration gradient in the thickness direction (the Z direction shown in the drawing).

When the antiferromagnetic layer 4 and the pinned magnetic layer 3 respectively have the regions A1 and B1 each containing the Cr element, the exchange coupling magnetic field (Hex) produced between the antiferromagnetic layer 4 and the pinned magnetic layer 3 is higher than that in a case in which the Cr element is not contained.

However, when a Cr element is mixed over the entire region of an antiferromagnetic material, antiferromagnetic properties tend to deteriorate. In this embodiment, therefore, the Cr element layer 50 is formed to such a small thickness as described above so that the antiferromagnetic layer 4 has a region A2 not containing the Cr element, for suppressing deterioration in the antiferromagnetic properties.

With the pinned magnetic layer 3 having the laminated ferrimagnetic structure, the first magnetic layer 13 preferably has a region B2 not containing the Cr element near the interface with the nonmagnetic intermediate layer 12 to the antiferromagnetic layer 4 side, thereby increasing the coupling magnetic field due to the RKKY interaction between the first and second magnetic layers 13 and 11 through the nonmagnetic intermediate layer 12.

Therefore, the exchange coupling magnetic field (Hex) produced between the first magnetic layer 13 and the antiferromagnetic layer 4 can be increased, and the coupling magnetic field due to the RKKY interaction can be increased, thereby increasing a one-directional exchange bias magnetic field (Hex*) in the pinned magnetic layer 3 as compared with a conventional exchange coupling film.

In the method shown in FIG. 7 in which the Cr element layer 50 is inserted into the first magnetic layer 13 of the pinned magnetic layer 3, the Cr element is easily mixed in the interface between the first magnetic layer 13 and the nonmagnetic intermediate layer 12, thereby easily causing a decrease in the coupling magnetic field due to the RKKY interaction between the first and second magnetic layers 13 and 11 through the nonmagnetic intermediate layer 12. Therefore, in the present invention, the Cr element layer 50 is preferably formed at the interface between the antiferromagnetic layer 4 and the pinned magnetic layer 3, or in the antiferromagnetic layer 4, as shown in FIG. 5 or 6.

FIG. 11C schematically shows the Cr element concentration gradients in the pinned magnetic layer 3 and the antiferromagnetic layer 4 after the heat treatment in this embodiment. The Cr element concentration gradients in the regions A1 and B1 are symmetrical with respect to the insertion position of the Cr element layer 50 in the first magnetic layer 13 of the pinned magnetic layer 3. Therefore, the Cr element content in the first magnetic layer 13 of the pinned magnetic layer 3 is higher than that in the antiferromagnetic layer 4.

A method of producing an exchange coupling film according to a further embodiment of the present invention will be described below with reference to FIG. 8.

An underlying layer 6 and a seed layer 22 are deposited in the same manner as the embodiment shown in FIG. 5.

Figure 8:
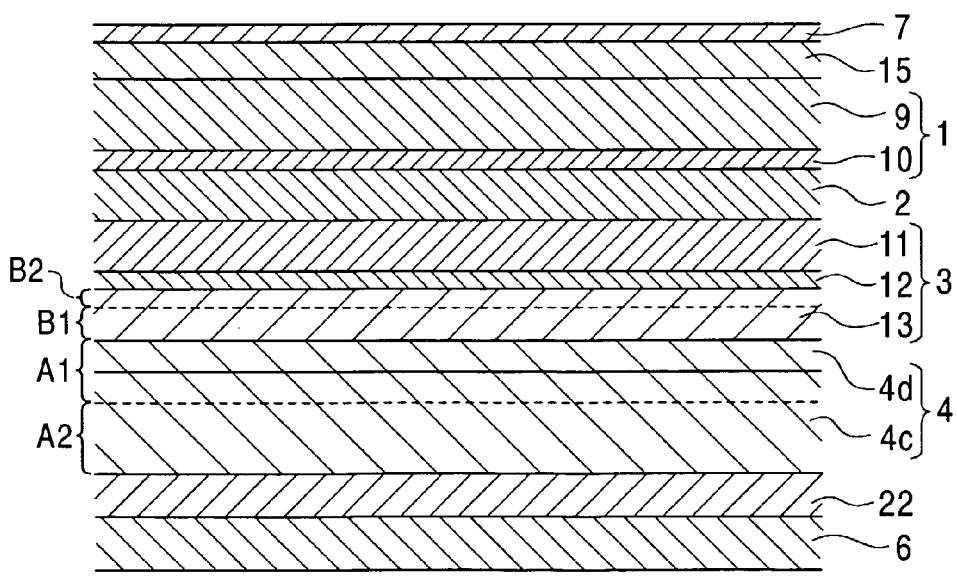
FIG. 8 is a schematic drawing illustrating a step of a method of producing an exchange coupling film and a magnetic detecting element according to the present invention.

As shown in FIG. 8, an antiferromagnetic material layer 4c comprising an antiferromagnetic material, and a Cr-containing layer 4d comprising the antiferromagnetic material to which a Cr element is added are deposited on the seed layer 22 by sputtering to form an antiferromagnetic layer 4. The Cr-containing layer 4d may be inserted into the antiferromagnetic layer 4, not at the interface between the antiferromagnetic layer 4 and a pinned magnetic layer 3.

The antiferromagnetic material layer 4c is made of an antiferromagnetic material containing element X (X is at least one element of Pt, Pd, Ir, Rh, Ru, and Os) and Mn, and preferably made of PtMn. The antiferromagnetic layer 4c may be made of a X—Mn—X' alloy (wherein element X' is at least one of Ne, Ar, Kr, Xe, Be, B, C, N, Mg, Al, Si, P, Ti, V, Fe, Co, Ni, Cu, Zn, Ga, Ge, Zr, Nb, Mo, Ag, Cd, Ir, Sn, Hf, Ta, W, Re, Au, Pb, and the rare earth elements).

In the present invention, the composition ratio of element X or element X+X' is preferably 45 at % to 60 at %.

The Cr-containing layer 4d is made of the antiferromagnetic material constituting the antiferromagnetic material layer 4c, and Cr is added thereto, i.e., X—Mn—Cr (X is at least one element of Pt, Pd, Ir, Rh, Ru, and Os) or X—Mn—X'—Cr alloy (wherein element X' is at least one of Ne, Ar, Kr, Xe, Be, B, C, N, Mg, Al, Si, P, Ti, V, Fe, Co, Ni, Cu, Zn, Ga, Ge, Zr, Nb, Mo, Ag, Cd, Ir, Sn, Hf, Ta, W, Re, Au, Pb, and the rare earth elements). The Cr-containing layer 4d is preferably made of PtMnCr.

In the present invention, the pinned magnetic layer 3 is formed in a laminated ferrimagnetic structure comprising a first magnetic layer 13 and a second magnetic layer 11 formed on the first magnetic layer 13 with a nonmagnetic intermediate layer 12 provided therebetween.

Each of the first and second magnetic layers 13 and 11 may be made of a CoFe alloy, a CoFeNi alloy, Co or a NiFe alloy. The nonmagnetic intermediate layer 12 is preferably made of an alloy composed of at least one element of Ru, Rh, Ir, Os, Re, and Cu.

Next, a nonmagnetic material layer 2 composed of Cu or the like, a free magnetic layer 1 comprising two films, for example, a CoFe alloy film 10 and a NiFe alloy film 9, a backed layer 15 composed of Cu or the like, and a protective layer 7 (which may be a specular reflection layer comprising, for example, a Ta oxide) are deposited on the second magnetic layer 11 by sputtering.

Furthermore, a heat treatment is performed at 290° C. for 4 hours in a magnetic field of 800 kA/m, and then the central portion of the protective layer 7 is masked with photoresist. Then, the underlying layer 6, the seed layer 22, the antiferromagnetic layer 4, the Cr element layer 50, the pinned magnetic layer 3, the nonmagnetic material layer 2, the free magnetic layer 1, and the backed layer 15 are removed from an unmasked portion by ion milling or the like. Then, hard bias layers 5 and electrode layers 8 are deposited, and the photoresist is then removed to obtain the magnetic detecting element shown in FIG. 1.

In this embodiment, by performing the heat treatment, a great exchange coupling magnetic field (Hex) can be produced between the first magnetic layer 13 and the antiferromagnetic layer 4.

Also, in the heat treatment, the Cr element constituting the Cr-containing layer 4d thermally diffuses to mix in the first magnetic layer 13 of the pinned magnetic layer 3 and the antiferromagnetic material layer 4c.

As a result, the content of the Cr element is constant within the position where the Cr-containing layer 4d of the antiferromagnetic layer 4 is formed, and the antiferromagnetic material layer 4c has a Cr concentration gradient.

Namely, the antiferromagnetic layer 4 has a region A1 containing the Cr element with a concentration gradient in the thickness direction (the Z direction shown in the drawing), and the first magnetic layer 13 of the pinned magnetic layer 3 has a region B1 containing the Cr element with a concentration gradient in the thickness direction (the Z direction shown in the drawing).

When the antiferromagnetic layer 4 and the pinned magnetic layer 3 respectively have the regions A1 and B1 each containing the Cr element, the exchange coupling magnetic field (Hex) produced between the antiferromagnetic layer 4 and the pinned magnetic layer 3 is higher than that in a case in which the Cr element is not contained.

However, when a Cr element is mixed over the entire region of an antiferromagnetic material, antiferromagnetic properties tend to deteriorate. In this embodiment, therefore, the Cr-containing layer 4d is formed to such a small thickness as described above so that the antiferromagnetic layer 4 has a region A2 not containing the Cr element, for suppressing deterioration in the antiferromagnetic properties.

With the pinned magnetic layer 3 having the ferrimagnetic laminated structure, the first magnetic layer 13 preferably has a region B2 not containing the Cr element near the interface with the nonmagnetic intermediate layer 12, thereby increasing the coupling magnetic field due to the RKKY interaction between the first and second magnetic layers 13 and 11 through the nonmagnetic intermediate layer 12.

Therefore, the exchange coupling magnetic field (Hex) produced between the first magnetic layer 13 and the antiferromagnetic layer 4 can be increased, and the coupling magnetic field due to the RKKY interaction can be increased, thereby increasing a one-directional exchange bias magnetic field (Hex*) in the pinned magnetic layer 3 as compared with a conventional exchange coupling film.

FIG. 11D schematically shows the Cr element concentration gradients in the pinned magnetic layer 3 and the antiferromagnetic layer 4 in this embodiment. The Cr element concentration gradients in the regions A1 and B1 are symmetrical with respect to the Cr-containing layer 4d. Therefore, the Cr element content in the antiferromagnetic layer 4 is higher than that in the first magnetic layer 13 of the pinned magnetic layer 3.

A method of producing an exchange coupling film according to a still further embodiment of the present invention will be described below with reference to FIG. 9.

An underlying layer 6 and a seed layer 22 are deposited in the same manner as the embodiment shown in FIG. 5.

Figure 9:
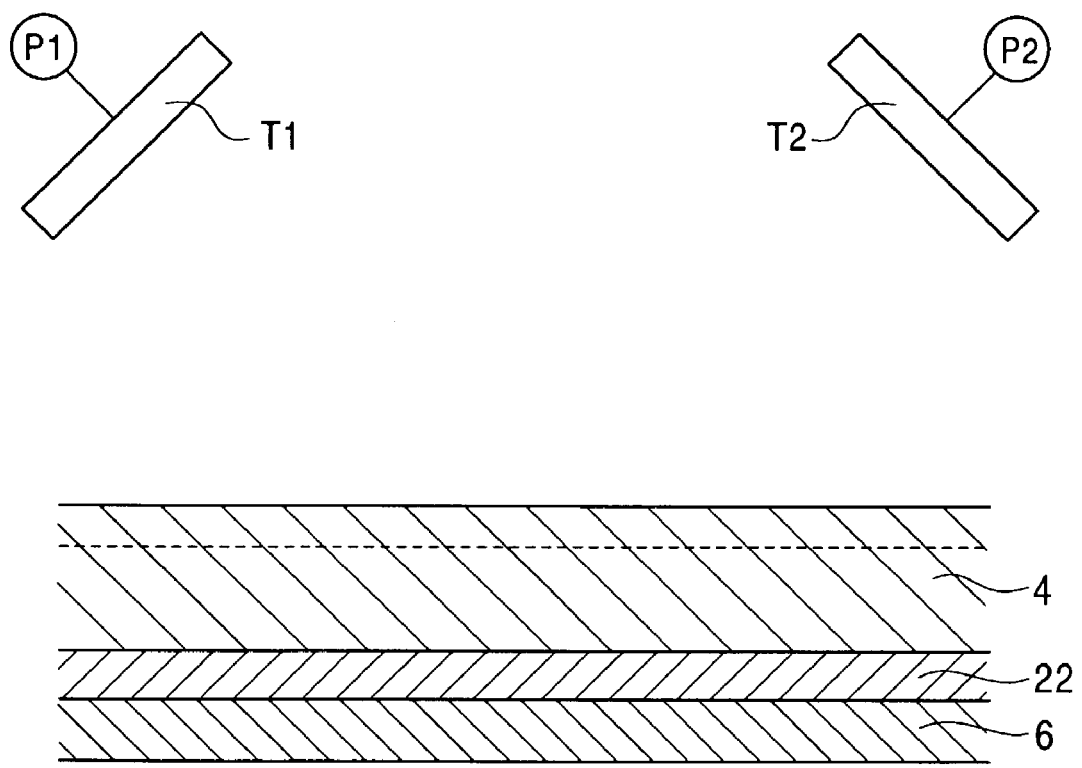
FIG. 9 is a schematic drawing illustrating a step of a method of producing an exchange coupling film and a magnetic detecting element according to the present invention.

In the embodiment shown in FIG. 9, a target T1 composed of an antiferromagnetic material, and a target T2 composed of Cr element are prepared. First, only the target T1 composed of the antiferromagnetic material is sputtered, and then the target T1 composed of the antiferromagnetic material and the target T2 composed of Cr element are simultaneously sputtered to mix the antiferromagnetic material and Cr element, forming an antiferromagnetic layer 4 containing the Cr element on a surface. During sputtering, electric power P1 supplied to the target T1 is constant, while electric power P2 supplied to the target T2 is gradually increased so that the Cr element ratio in the deposited antiferromagnetic layer 4 increases in the direction nearer to the surface of the antiferromagnetic layer 4.

For example, the target T1 is composed of PtMn.

After the antiferromagnetic layer 4 is deposited, a pinned magnetic layer 3 comprising a ferromagnetic layer of the present invention is deposited by sputtering.

The pinned magnetic layer 3 is formed in a laminated ferrimagnetic structure comprising a first magnetic layer 13 and a second magnetic layer 11 formed on the first magnetic layer 13 with a nonmagnetic intermediate layer 12 provided therebetween.

Each of the first and second magnetic layers 13 and 11 may be made of a CoFe alloy, a CoFeNi alloy, Co or a NiFe alloy. The nonmagnetic intermediate layer 12 is preferably made of an alloy composed of at least one element of Ru, Rh, Ir, Os, Re, and Cu.

Figure 10:
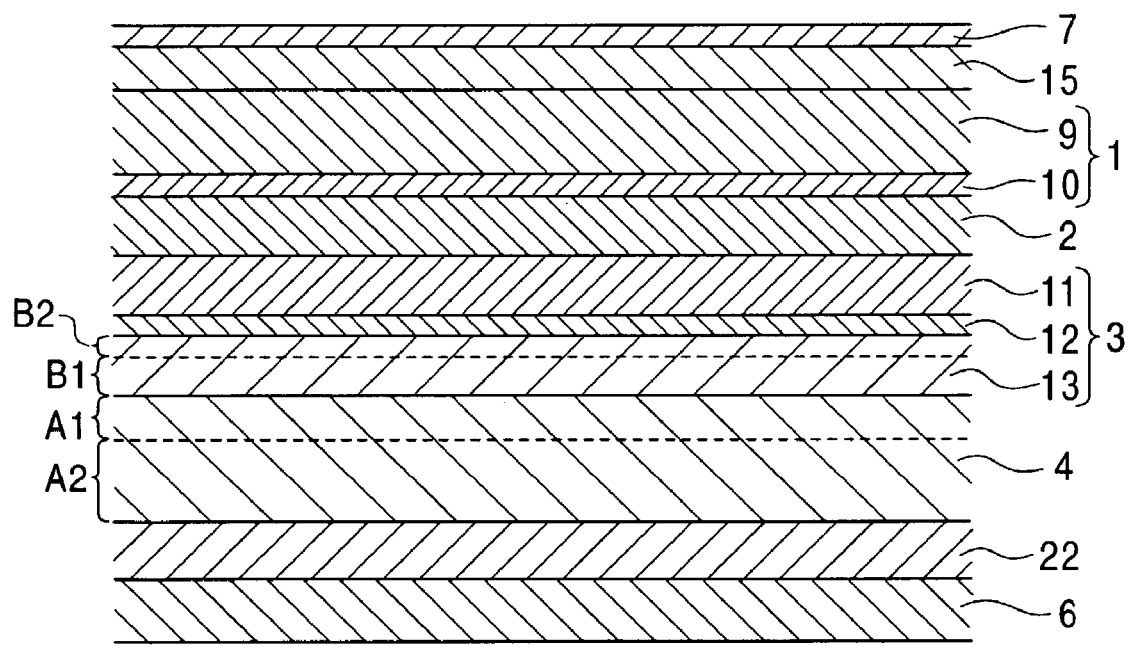
FIG. 10 is a schematic drawing illustrating a step of a method of producing an exchange coupling film and a magnetic detecting element according to the present invention.

Next, a nonmagnetic material layer 2 composed of Cu or the like, a free magnetic layer 1 comprising two films, for example, a CoFe alloy film 10 and a NiFe alloy film 9, a backed layer is composed of Cu or the like, and a protective layer 7 (which may be a specular reflection layer comprising, for example, a Ta oxide) are deposited on the second magnetic layer 11 by sputtering. FIG. 10 shows a state of these deposited layers.

Then, a heat treatment is performed at 290° C. for 4 hours in a magnetic field of 800 kA/m, and then the central portion of the protective layer 7 is masked with photoresist. Then, the underlying layer 6, the seed layer 22, the antiferromagnetic layer 4, the Cr element layer 50, the pinned magnetic layer 3, the nonmagnetic material layer 2, the free magnetic layer 1, and the backed layer 15 are removed from an unmasked portion by ion milling or the like. Then, hard bias layers 5 and electrode layers 8 are deposited, and the photoresist is then removed to obtain the magnetic detecting element shown in FIG. 1.

In this embodiment, by performing the heat treatment, a great exchange coupling magnetic field (Hex) can be produced between the first magnetic layer 13 and the antiferromagnetic layer 4.

Also, in the heat treatment, the Cr element thermally diffuses to mix in the first magnetic layer 13 of the pinned magnetic layer 3.

Namely, after heat treatment, the antiferromagnetic layer 4 has a region A1 containing the Cr element with a concentration gradient in the thickness direction (the Z direction shown in the drawing), and the first magnetic layer 13 of the pinned magnetic layer 3 has a region B1 containing the Cr element with a concentration gradient in the thickness direction (the Z direction shown in the drawing).

When the antiferromagnetic layer 4 and the pinned magnetic layer 3 respectively have the regions A1 and B1 each containing the Cr element, the exchange coupling magnetic field (Hex) produced between the antiferromagnetic layer 4 and the pinned magnetic layer 3 is higher than that in a case in which the Cr element is not contained.

However, when a Cr element is mixed over the entire region of an antiferromagnetic material, antiferromagnetic properties tend to deteriorate. In this embodiment, therefore, sputtering of the Cr element is started in the course of deposition of the antiferromagnetic layer 4 so that the antiferromagnetic layer 4 has a region A2 not containing the Cr element, for suppressing deterioration in the antiferromagnetic properties.

FIG. 11E schematically shows the Cr element concentration gradients in the pinned magnetic layer 3 and the antiferromagnetic layer 4 in this embodiment. In the heat treatment process, the Cr element contained in the antiferromagnetic layer 4 diffuses to mix in the first magnetic layer 13 of the pinned magnetic layer 3. Therefore, the Cr element concentration gradients in the regions A1 and B1 tend to exhibit an asymmetry with respect to the interface between the pinned magnetic layer 3 and the antiferromagnetic layer 4. Therefore, the Cr element content in the antiferromagnetic layer 4 is higher than that in the first magnetic layer 13 of the pinned magnetic layer 3.

In the method of producing the magnetic detecting element according to each of the embodiments, when the pinned magnetic layer 3 has the laminated ferrimagnetic structure, the Cr element may also be present at the interface between the first magnetic layer 13 and the nonmagnetic intermediate layer 12, and the Cr element content at the interface between the first magnetic layer 13 and the antiferromagnetic layer 4 may be higher than that at the interface with the nonmagnetic intermediate layer 12. In this case, a one-directional exchange bias magnetic field (Hex*) in the pinned magnetic layer 3 can be appropriately increased, as compared with a conventional exchange coupling film.

However, in order to increase the coupling magnetic field due to the RKKY interaction produced between the first and second magnetic layers 13 and 11 through the nonmagnetic intermediate layer 12, a region B2 not containing the Cr element is preferably present near the interface with the nonmagnetic intermediate layer 12.

In the magnetic detecting element produced by the method of producing the magnetic detecting element of the present invention, even when the track width dimensions of the antiferromagnetic layer 4 and the pinned magnetic layer 3, and the thickness dimension and height dimension of the antiferromagnetic layer 4 are decreased for further narrowing the track width and gap of the magnetic detecting element, the magnetization direction of the pinned magnetic layer 3 can be securely pinned in a direction.

Namely, in the present invention, the crossing angle between the magnetization directions of the pinned magnetic layer 3 and the free magnetic layer 1 can easily be kept constant, thereby decreasing a degree of asymmetry of an output signal waveform.

Also, the one-directional exchange bias magnetic field (Hex*), particularly the exchange coupling magnetic field (Hex), can be increased to improve ESD resistance and electromigration resistance which are representative of communication reliability.

Although the present invention is described above with reference to the preferred embodiments, various changes can be made within the scope of the present invention.

The above-described embodiments are just examples, and the present invention is not limited to these embodiments.

EXAMPLES

Studies were made of the thickness and formation position of the Cr element layer 50 formed in the method of producing the exchange coupling film shown in each of FIGS. 5, 6 and 7. In the description below, a Cr element layer means a thin film layer comprising only Cr.

Figure 12:
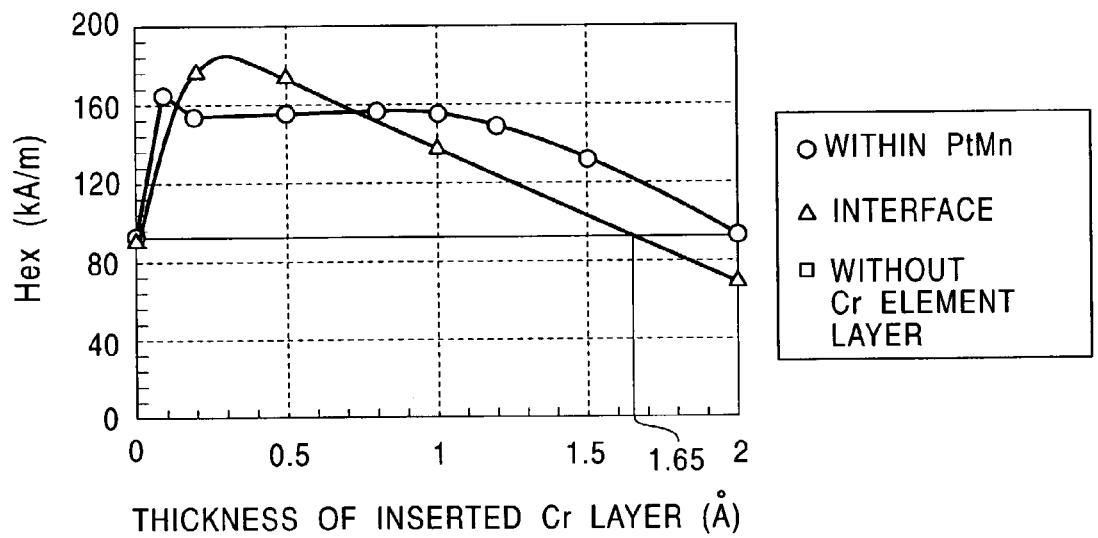
FIG. 12 is a graph showing changes in the exchange coupling magnetic field produced in an exchange coupling film after heat treatment with changes in the thickness of each of a Cr element layer inserted into the interface between a pinned magnetic layer and an antiferromagnetic layer, or a Cr element layer inserted into the antiferromagnetic layer.

In a graph of FIG. 12, a solid line of Δ shows changes in the exchange coupling magnetic field of an exchange coupling film (corresponding to the exchange coupling film shown in FIG. 5) after heat treatment with changes in the thickness of a Cr element layer inserted into the interface between a pinned magnetic layer and an antiferromagnetic layer.

In experiments, a thin film laminate having the following film structure was used.

Thin film laminate: silicon substrate/alumina (1000 Å)/ $(Ni_{0.8}Fe_{0.2})_{60}Cr_{40}$ (55 Å)/$Pt_{50}Mn_{50}$ (160 Å)/Cr (X Å)/$Co_{90}Fe_{10}$ (16 Å)/Cu (40 Å)/$Co_{90}Fe_{10}$ (10 Å)/$Ni_{80}Fe_{20}$ (50 Å)/Ta (30 Å) Each of the films was formed as a solid film.

In the graph of FIG. 12, a solid line of ○ shows changes in the exchange coupling magnetic field of an exchange coupling film (corresponding to the exchange coupling film shown in FIG. 6) after heat treatment with changes in the thickness of a Cr element layer inserted into an antiferromagnetic layer at a distance of 5 Å from the interface.

The average thickness of the Cr element layer can be measured by using a fluorescent X-ray spectroscopic analyzer.

In the present invention, the average thickness of the Cr element layer may be less than 1 Å. As is generally known, a thickness of 1 Å corresponds to the diameter of one atom or less, and there is thus no uniform thin film of less than 1 Å thick. However, a thin film containing Cr atoms nonuniformly present, i.e., sparsely present, has a region containing Cr, and a region not containing Cr. As a result, when the average thickness of the Cr element layer is defined as described above, the average thickness of the Cr element layer is less than 1 Å in some cases.

In experiments, a thin film laminate having the following film structure was used.

Thin film laminate: silicon substrate/alumina (1000 Å)/ $(Ni_{0.8}Fe_{0.2})_{60}Cr_{40}$ (55 Å)/$Pt_{50}Mn_{50}$ (150 Å)/$Pt_{50}Mn_{50}$ (5−x/2 Å)/Cr (x Å)/$Pt_{50}Mn_{50}$ (5−x/2 Å)/$Co_{90}Fe_{10}$ (16 Å)/Cu (40 Å)/$Co_{90}Fe_{10}$ (10 Å)/$Ni_{80}Fe_{20}$ (50 Å)/Ta (30 Å).

Each of the thin film laminates was annealed at 290° C. for 4 hours in a magnetic field of 800 (kA/m).

When an antiferromagnetic layer and a pinned magnetic layer formed in direct contact with each other without a Cr element layer inserted into the interface therebetween were annealed in a magnetic field, the exchange coupling magnetic field Hex between the antiferromagnetic layer and the pinned magnetic layer was 93 (kA/m).

FIG. 12 indicates that with the Cr element layer inserted in the interface between the antiferromagnetic layer and the pinned magnetic layer, the exchange coupling magnetic field Hex between the antiferromagnetic layer and the pinned magnetic layer rapidly increases as the average thickness of the Cr element layer increases in the range of 0 Å to 0.3 Å. When the average thickness of the Cr element layer is 0.3 Å, the exchange coupling magnetic field Hex between the antiferromagnetic layer and the pinned magnetic layer is 172 (kA/m). However, the exchange coupling magnetic field Hex between the antiferromagnetic layer and the pinned magnetic layer gradually decreases as the average thickness of the Cr element layer increases from 0.3 Å. Particularly, when the average thickness of the Cr element layer is 1.65 Å or more, the exchange coupling magnetic field Hex between the antiferromagnetic layer and the pinned magnetic layer is lower than that in a case in which the Cr element layer is not inserted.

The average thickness of the Cr element layer is preferably in the range of 0.1 Å to 1.65 Å because an exchange coupling magnetic field Hex of 93 (kA/m) or more, which is higher than that obtained without the Cr element layer, can be obtained The average thickness of the Cr element layer is more preferably in the range of 0.1 Å to 1.0 Å because an exchange coupling magnetic field Hex of 140 (kA/m) or more can be obtained. The average thickness of the Cr element layer is most preferably in the range of 0.15 Å to 0.5 Å because an exchange coupling magnetic field Hex of 170 (kA/m) or more can be obtained.

On the other hand, when the Cr element layer is inserted into the antiferromagnetic layer at a distance of 5 Å from the interface between the antiferromagnetic layer and the pinned magnetic layer, the average thickness of the Cr element layer is preferably in the range of 0.1 Å to 2.0 Å because an exchange coupling magnetic field Hex of 93 (kA/m) or more, which is higher than that obtained without the Cr element layer, can be obtained between the antiferromagnetic layer and the pinned magnetic layer. With the Cr element layer having an average thickness in the range of 0.1 Å to 1.0 Å, an exchange coupling magnetic field Hex is stable between 152 (kA/m) and 160 (kA/m). With the Cr element layer having an average thickness in the range of 0.1 Å to 0.5 Å, an exchange coupling magnetic field Hex is stable between 152 (kA/m) and 160 (kA/m).

The exchange coupling magnetic field Hex gradually decreases as the average thickness of the Cr element layer increases from 1.0 Å, and when the Cr element layer has an average thickness of 2.0 Å or more, the exchange coupling magnetic field Hex between the antiferromagnetic layer and the pinned magnetic layer is lower than that obtained without the Cr element layer.

The results shown in FIG. 12 indicate that in order to obtain the maximum exchange coupling magnetic field Hex between the antiferromagnetic layer and the pinned magnetic layer, the antiferromagnetic layer and the pinned magnetic layer with the Cr element layer inserted in the interface therebetween are preferably annealed in a magnetic field It is also found that in order to obtain the stable exchange coupling magnetic field Hex with changes in the average thickness of the Cr element layer, the antiferromagnetic layer and the pinned magnetic layer with the Cr element layer inserted in the antiferromagnetic layer are preferably annealed in a magnetic field.

Figure 13:
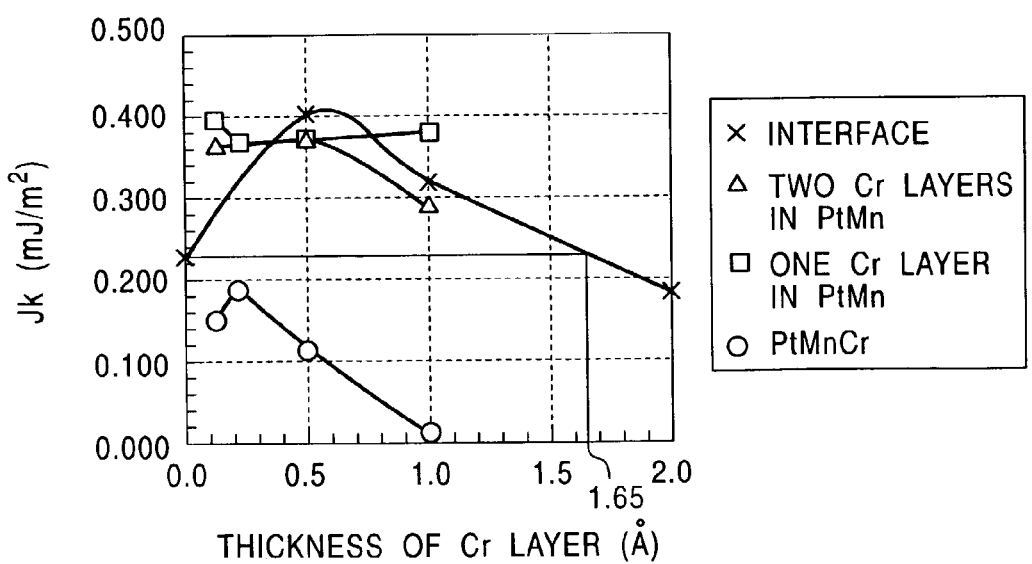
FIG. 13 is a graph showing changes in the exchange coupling energy Jk between an antiferromagnetic layer and a pinned magnetic layer with changes in the insertion position and thickness of a Cr element layer.

FIG. 13 is a graph showing the results of measurement of exchange coupling energy Jk between an antiferromagnetic layer and a pinned magnetic layer with changes in the insertion position and the thickness of a Cr element layer.

In the graph of FIG. 13, a solid line of X shows the exchange coupling energy Jk of an exchange coupling film (corresponding to the exchange coupling film shown in FIG. 5) after heat treatment, with the Cr element layer inserted into the interface between the pinned magnetic layer and the antiferromagnetic layer. A solid line of □ shows the exchange coupling energy Jk of an exchange coupling film (corresponding to the exchange coupling film shown in FIG. 6) after heat treatment, with the Cr element layer inserted into the antiferromagnetic layer at a distance of 5 Å from the interface. A solid line of Δ shows the exchange coupling energy Jk of an exchange coupling film after heat treatment, with the Cr element layers respectively inserted into the antiferromagnetic layer at distances of 5 Å and 15 Å from the interface. A solid line of ○ shows the exchange coupling energy Jk between the pinned magnetic layer and the antiferromagnetic layer entirely composed of a PtMnCr alloy.

In a thin film laminate having the following film structure, only the film structure of (antiferromagnetic layer+Cr element layer) was changed in experiments.

Silicon substrate/alumina (1000 Å)/$(Ni_{0.8}Fe_{0.2})_{60}Cr_{40}$ (55 Å)/(antiferromagnetic layer+Cr element layer)/$Co_{90}Fe_{10}$ (16 Å)/Cu (40 Å)/$Co_{90}Fe_{10}$ (10 Å)/$Ni_{80}Fe_{20}$ (50 Å)/Ta (30 Å)

A film structure (X) of (antiferromagnetic layer+Cr element layer) in which a Cr element layer was inserted into the interface between the antiferromagnetic layer and the pinned magnetic layer was /$Pt_{50}Mn_{50}$ (160 Å)/Cr (x Å)/. A film structure (Δ) in which two Cr element layers were inserted into the antiferromagnetic layer was /$Pt_{50}Mn_{50}$ (145−x/2 Å)/Cr (x Å)/$Pt_{50}Mn_{50}$ (10−x Å)/Cr (x Å)/$Pt_{50}Mn_{50}$ (5−x/2 Å)/. A film structure (□) in which only one Cr element layer was inserted into the antiferromagnetic layer was /$Pt_{50}Mn_{50}$ (150 Å)/$Pt_{50}Mn_{50}$ ((5−x)/2 Å)/Cr (x Å)/$Pt_{50}Mn_{50}$ ((5−x)/2 Å). The antiferromagnetic layer entirely comprising a PtMnCr alloy was formed by laminating [$Pt_{50}Mn_{50}$ (5−x/2 Å)/Cr (x Å)/$Pt_{50}Mn_{50}$ ((5−x)/2 Å)] 16 times, and then annealing the resultant laminate to form the PtMnCr alloy. With the Cr element layers respectively having thicknesses x of 0.1 Å, 0.2 Å, 0.5 Å, and 1.0 Å, the compositions of the formed PtMnCr alloys were $Pt_{49.4}Mn_{49.4}Cr_{1.1}$, $Pt_{48.9}Mn_{48.9}Cr_{2.3}$, $Pt_{47.2}Mn_{47.2}Cr_{5.6}$, and $Pt_{44.4}Mn_{44.4}Cr_{11.3}$, respectively.

As shown in FIG. 13, the exchange coupling film (X) comprising the Cr element layer inserted into the interface between the pinned magnetic layer and the antiferromagnetic layer, and the exchange coupling film (□) comprising the Cr element layer inserted into the antiferromagnetic layer at a distance of 5 Å from the interface show the same results of exchange coupling magnetic field as shown in FIG. 12.

FIG. 13 indicates that in the exchange coupling film (X) comprising the Cr element layer inserted into the interface between the pinned magnetic layer and the antiferromagnetic layer, an exchange coupling energy Jk of 0.225 (mJ/m$^2$) higher than that obtained without the Cr element layer can be obtained when the average thickness of the Cr element layer is in the range of 0.1 Å to 1.65 Å.

It is also found that in the exchange coupling film (Δ) comprising the Cr element layers respectively inserted into the antiferromagnetic layer at distances of 5 Å and 15 Å from the interface, when the thickness of each Cr element layer (the thicknesses of both Cr element layers were simultaneously changed) is in the range of 0.1 Å to 0.5 Å, the exchange coupling energy Jk is the same level as the exchange coupling film (□) comprising only one Cr element layer inserted into the antiferromagnetic layer. However, in the exchange coupling film (Δ) comprising the Cr element layers having a thickness of 0.5 Å or more, the exchange coupling energy Jk decreases.

Furthermore, in the exchange coupling film comprising the antiferromagnetic layer entirely composed of the PtMnCr alloy, the exchange coupling energy Jk is lower than the exchange coupling film comprising the pinned magnetic layer and the antiferromagnetic layer composed of only PtMn without the Cr element layer inserted therebetween.

In the present invention, on the basis of these results, the Cr element layer having a thickness of 0.1 Å to 2.0 Å is preferably formed at the interface between the antiferromagnetic layer and the pinned magnetic layer or in a region of the antiferromagnetic layer near the interface. The thickness of the Cr element layer is more preferably 0.1 Å to 1.0 Å and most preferably 0.1 Å to 0.5 Å.

In the experiments, the "region of the antiferromagnetic layer near the interface" is, for example, a region of the antiferromagnetic layer at a distance of 15 Å from the interface, and preferably a region of the antiferromagnetic layer at a distance of 5 Å from the interface.

Also, only one Cr element layer is preferably inserted into the antiferromagnetic layer.

Next, experiments were carried out for studying a preferred deposition position of the Cr element layer in a region including the antiferromagnetic layer and the pinned magnetic layer.

The Cr element layer of 0.2 Å thick was inserted at various positions, such as the interface between the pinned magnetic layer and the antiferromagnetic layer, a position in the pinned magnetic layer, and a position in the antiferromagnetic layer to form exchange coupling films, and exchange coupling energy Jk of each exchange coupling film after heat treatment was measured.

A film structure of the thin film laminate used in the experiments is as follows, except the Cr element layer.

Silicon substrate/alumina (1000 Å)/(Ni$_{0.8}$Fe$_{0.2}$)$_{60}$Cr$_{40}$ (55 Å)/Pt$_{50}$Mn$_{50}$ (160 Å)/Co$_{90}$Fe$_{10}$ (16 Å)/Cu (40 Å)/C$_{90}$Fe$_{10}$ (10 Å)/Ni$_{80}$Fe$_{20}$ (50 Å)/Ta (30 Å)

The conditions of heat treatment in a magnetic field included a temperature of 290° C., a retention time of 4 hours, and a magnetic field intensity of 800 (kA/m).

Figure 14:
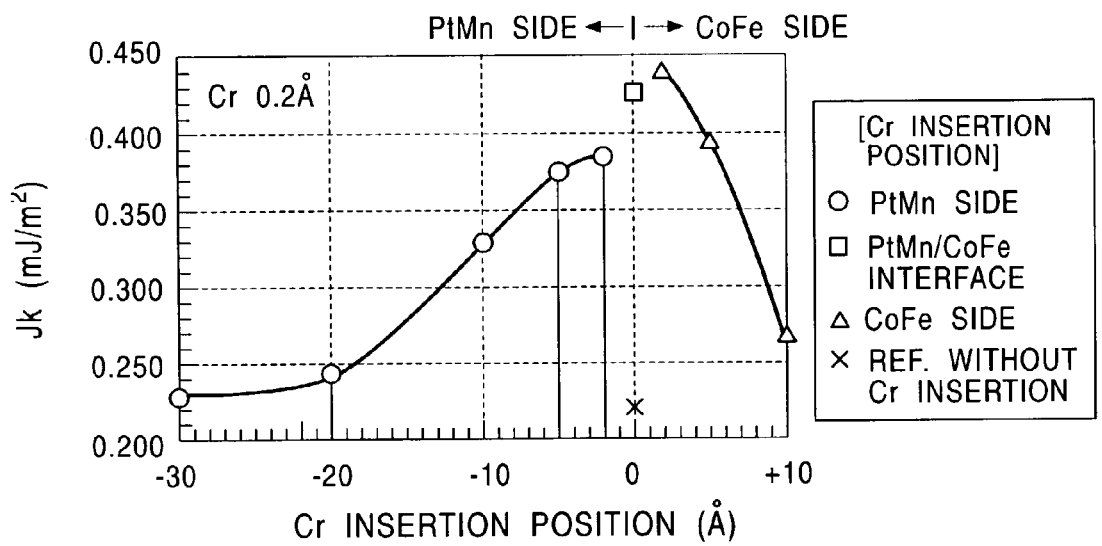
FIG. 14 is a graph showing changes in exchange coupling energy Jk of an exchange coupling film after heat treatment with changes in the insertion position of a Cr element layer of 0.2 Å thick in the interface between a pinned magnetic layer and an antiferromagnetic layer, in the pinned magnetic layer, and in the antiferromagnetic layer.

The results are shown in FIG. 14. In FIG. 14, insertion positions of the Cr element layer are shown on the abscissa. On the abscissa, insertion positions of the Cr element layer in the pinned magnetic layer are shown in the positive direction, and insertion positions of the Cr element layer in the antiferromagnetic layer are shown in the negative direction with the interface between the antiferromagnetic layer and the pinned magnetic layer at 0. For example, the insertion position −5 Å of the Cr element layer represents that the Cr element layer is inserted into the antiferromagnetic layer at a distance of 5 Å from the interface, and the insertion position +10 Å of the Cr element layer represents that the Cr element layer is inserted into the pinned magnetic layer at a distance of 10 Å from the interface.

In magnetic field annealing the antiferromagnetic layer and the pinned magnetic layer formed in direct contact with each other without the Cr element layer inserted therebetween, the exchange coupling energy Jk between the antiferromagnetic layer and the pinned magnetic layer was 0.222 (mJ/m$^2$).

With the Cr element layer of 0.2 Å thick inserted at the interface between the antiferromagnetic layer and the pinned magnetic layer, an exchange coupling energy Jk of 0.425 (mJ/m$^2$) could be produced.

The results of the experiments reveal that in the exchange coupling film comprising the Cr element layer inserted into the antiferromagnetic layer at a distance of 2 Å to 5 Å from the interface, an exchange coupling energy Jk of 0.370 (mJ/m$^2$) to 0.375 (mJ/m$^2$) can be produced. Also, the rate of decrease in the exchange coupling energy Jk increases in the direction away from the insertion position of the Cr element layer in the antiferromagnetic layer at a distance of 5 Å from the interface. In the exchange coupling film comprising the antiferromagnetic layer containing the Cr element layer inserted 20 Å apart from the interface, the exchange coupling energy Jk is 0.245 (mJ/m$^2$). Furthermore, the exchange coupling energy Jk is substantially constant when the Cr element layer is inserted into the antiferromagnetic layer at a distance of 20 Å or more from the interface.

On the other hand, in the exchange coupling film comprising the Cr element layer inserted into the pinned magnetic layer at a distance of 2 Å from the interface, an exchange coupling energy of 0.440 (mJ/m$^2$) can be obtained. This exchange coupling energy Jk is higher than that obtained by the exchange coupling film comprising the Cr element layer inserted into the antiferromagnetic layer. However, the rate of decrease in the exchange coupling energy Jk significantly increases as the insertion position of the Cr element layer in the pinned magnetic layer gets away from the interface. As a result, in the exchange coupling film comprising the Cr element layer inserted into the pinned magnetic layer at a distance of 10 Å from the interface, the exchange coupling energy Jk is 0.270 (mJ/m$^2$).

These results indicate that rather than into the pinned magnetic layer, the Cr element layer is preferably inserted into the interface between the pinned magnetic layer and the antiferromagnetic layer or into the antiferromagnetic layer because an error of the insertion position of the Cr element position causes less influence, thereby obtaining an exchange coupling film producing stable great exchange coupling energy Jk.

Figure 15:
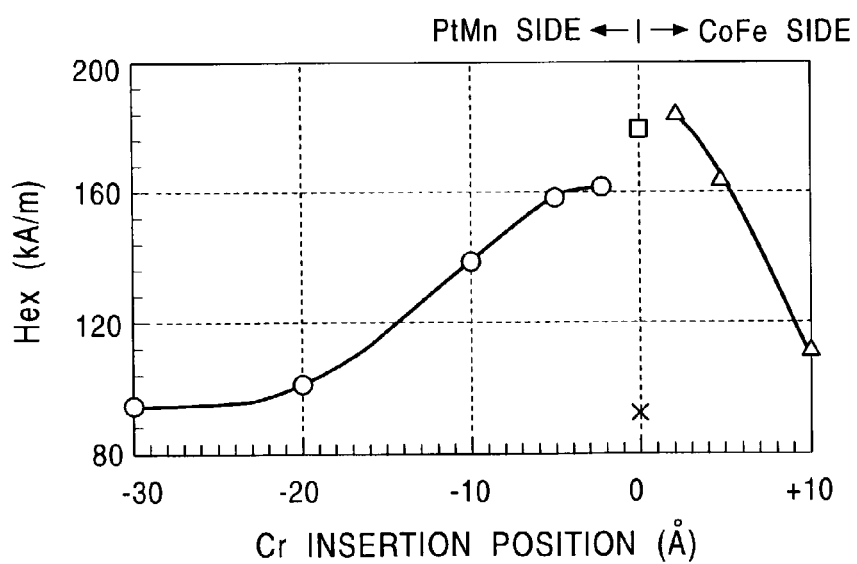
FIG. 15 is a graph showing changes in an exchange coupling magnetic field (Hex) between a pinned magnetic layer and an antiferromagnetic layer with changes in the insertion position of a Cr element layer.

FIG. 15 is a graph in which the exchange coupling energy Jk on the ordinate in the graph of FIG. 14 is converted into the exchange coupling magnetic field (Hex) between the pinned magnetic layer and the antiferromagnetic layer.

In FIG. 15, changes in the exchange coupling magnetic field (Hex) between the pinned magnetic layer and the antiferromagnetic layer with changes in the insertion position of the Cr element layer within the antiferromagnetic layer or the pinned magnetic layer are the same as the changes in the exchange coupling energy Jk with changes in the insertion position of the Cr element layer shown in FIG. 14.

Therefore, it is found that the insertion position of the Cr element layer within the antiferromagnetic layer is preferably in the range of 2 Å to 20 Å from the interface because an unexpected great exchange coupling magnetic field Hex of 60 kA/m or more and great exchange coupling energy Jk of 0.245 mJ/m$^2$ are obtained, as compared with a case in which the Cr element layer is not inserted.

Also, the exchange coupling film comprising the Cr element layer inserted into the antiferromagnetic layer at a distance of 2 Å to 5 Å from the interface is preferred because a stable great exchange coupling energy Jk of 0.370 (mJ/m$^2$) to 0.375 (mJ/m$^2$) and a stable great exchange coupling magnetic field Hex of 158 (kA/m) to 160 (kA/m) can be obtained.

Figure 16:
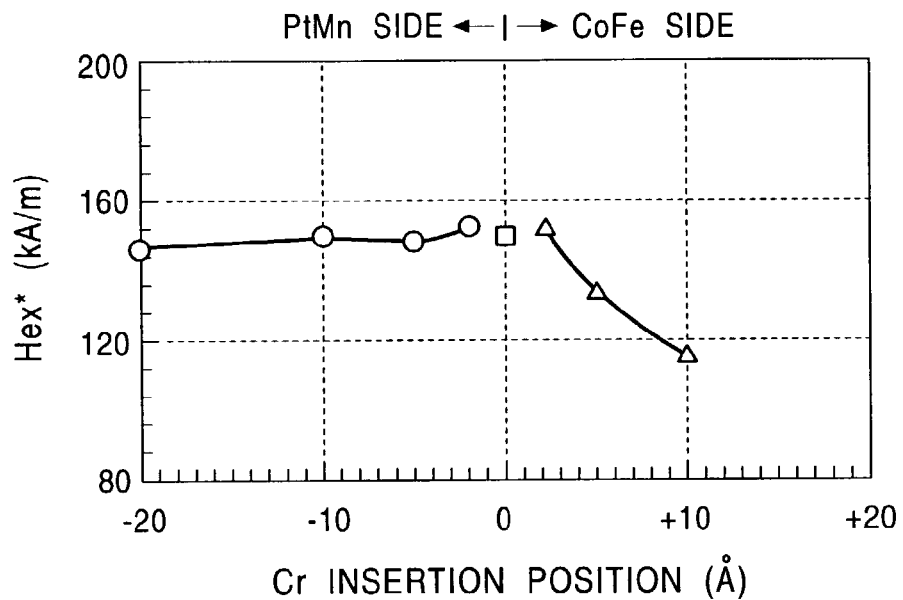
FIG. 16 is a graph showing changes in a one-directional exchange bias magnetic field (Hex*) of an exchange coupling film after heat treatment with changes in the insertion position of a Cr element layer of 0.2 Å thick in the interface between a pinned magnetic layer and an antiferromagnetic layer, in the pinned magnetic layer, and in the antiferromagnetic layer, the pinned magnetic layer having a laminated ferrimagnetic structure comprising first and second magnetic layers laminated with a nonmagnetic intermediate layer provided therebetween.
Figure 17:
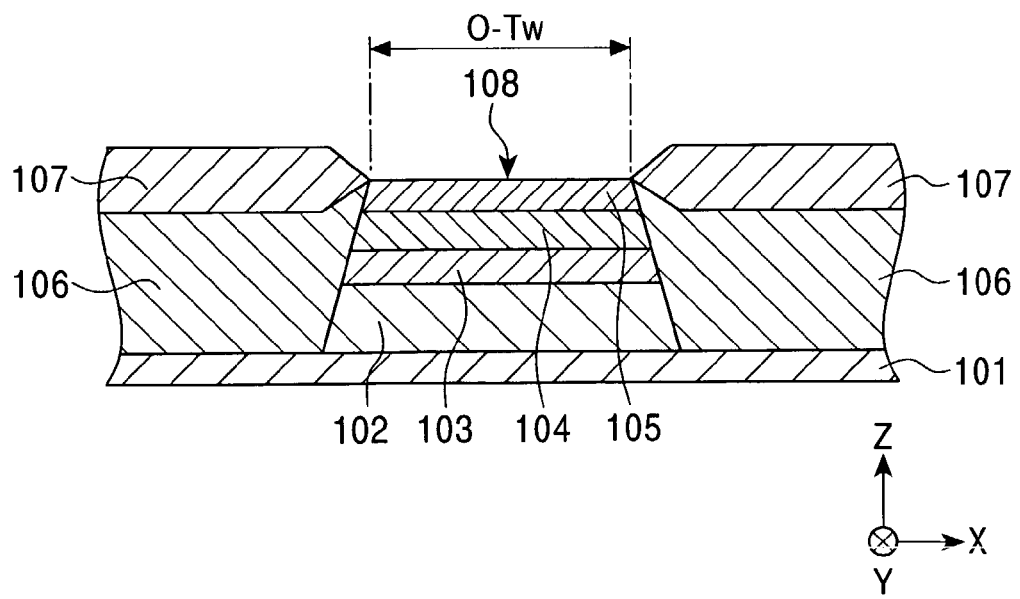
FIG. 17 is a sectional view of a structure of a conventional magnetic detecting element, as viewed from a side facing a recording medium.

FIG. 16 shows the results of measurement of one-directional exchange bias magnetic fields (Hex*) after heat treatment of exchange coupling films respectively comprising Cr element layers of 0.2 Å thick inserted at various positions including the interface between a pinned magnetic layer and an antiferromagnetic layer, a position in the pinned magnetic layer, and a position in the antiferromagnetic layer. The pinned magnetic layer has a laminated ferrimagnetic structure comprising first and second magnetic layers with a nonmagnetic intermediate layer provided therebetween.

The film structure of a thin film laminate used in experiments is as follows, except the Cr element layer.

Silicon substrate/alumina (1000 Å)/(Ni$_{0.8}$Fe$_{0.2}$)$_{60}$Cr$_{40}$ (52 Å)/Pt$_{50}$Mn$_{50}$ (120 Å)/Co$_{90}$Fe$_{10}$ (16 Å)/Ru/Co$_{90}$Fe$_{10}$ (22 Å)/Cu (21 Å)/Co$_{90}$Fe$_{10}$ (10 Å)/Ni$_{80}$Fe$_{20}$ (35 Å)/Ta (30 Å)

The conditions of a heat treatment in a magnetic field included a temperature of 290° C., a retention time of 4 hours, and a magnetic field intensity of 800 (kA/m).

In FIG. 16, insertion positions of the Cr element layer are shown on the abscissa. On the abscissa, insertion positions of the Cr element layer in the pinned magnetic layer are shown in the positive direction, and insertion positions of the Cr element layer in the antiferromagnetic layer are shown in the negative direction with the interface between the antiferromagnetic layer and the pinned magnetic layer at 0. For example, the insertion position −5 Å of the Cr element layer represents that the Cr element layer is inserted into the antiferromagnetic layer at a distance of 5 Å away from the interface, and the insertion position +10 Å of the Cr element layer represents that the Cr element layer is inserted into the pinned magnetic layer at a distance of 10 Å away from the interface.

As shown in FIG. 16, with the Cr element layer of 0.2 Å thick inserted at the interface between the antiferromagnetic layer and the pinned magnetic layer, a one-directional exchange bias magnetic field (Hex*) of 148 (kA/m) could be produced.

The results of the experiments reveal that in the exchange coupling film comprising the Cr element layer inserted into the antiferromagnetic layer, a one-directional exchange bias magnetic field (Hex*) of 148 (kA/m) to 152 (kA/m) can be produced regardless of the insertion position of the Cr element layer.

On the other hand, in the exchange coupling film comprising the Cr element layer inserted into the pinned magnetic layer at a distance of 2 Å from the interface, a one-directional exchange bias magnetic field of 148 (kA/m) can be obtained. However, the rate of decrease in the one-directional exchange bias magnetic field (Hex*) significantly increases as the insertion position of the Cr element layer in the pinned magnetic layer gets away from the interface. As a result, in the exchange coupling film comprising the Cr element layer inserted into the pinned magnetic layer at a distance of 10 Å from the interface, the one-directional exchange bias magnetic field (Hex*) is 116 (kA/m).

These results indicate that rather than into the pinned magnetic layer, the Cr element layer is preferably inserted into the interface between the pinned magnetic layer and the antiferromagnetic layer or into the antiferromagnetic layer because an error of the insertion position of the Cr element position causes less influence, thereby obtaining an exchange coupling film producing a stable great exchange one-directional exchange bias magnetic field (Hex*).

As described in detail above, an exchange coupling magnetic field of the present invention comprises an antiferromagnetic layer and a ferromagnetic layer, the antiferromagnetic layer and/or the ferromagnetic layer having a region containing a Cr element with a concentration gradient in the thickness direction.

When the antiferromagnetic layer and/or the ferromagnetic layer contains a Cr element, the exchange coupling magnetic field (Hex) produced between the antiferromagnetic layer and the ferromagnetic layer can be increased, as compared with a case in which the Cr element is not contained.

Furthermore, the exchange coupling magnetic field (Hex) produced between the antiferromagnetic layer and the ferromagnetic layer can be increased by changing the Cr concentration within the antiferromagnetic layer and the ferromagnetic layer.

Particularly, when the Cr element is present at the interface between the antiferromagnetic layer and the ferromagnetic layer, the exchange coupling magnetic field (Hex) produced between the antiferromagnetic layer and the ferromagnetic layer can be effectively increased.

A method of producing an exchange coupling film of the present invention comprises a step of laminating an antiferromagnetic layer and a ferromagnetic layer with a Cr element layer provided therebetween, and a step of performing a heat treatment to produce an exchange coupling magnetic field between the antiferromagnetic layer and the ferromagnetic layer. The method can form an exchange coupling film in which the Cr element content has a maximum at the interface between the antiferromagnetic layer and the ferromagnetic layer, and gradually decreases in the direction away from the interface.

Another method of producing an exchange coupling film of the present invention comprises a step of laminating first and second antiferromagnetic layers with a Cr element layer provided therebetween, a step of forming a ferromagnetic layer in contact with the first or second antiferromagnetic layer, and a step of performing a heat treatment to produce an exchange coupling magnetic field between the first or second antiferromagnetic layer and the ferromagnetic layer. The method can form an exchange coupling film in which the Cr element content has a maximum in a predetermined region of the first or second antiferromagnetic layer, apart from the interface, and gradually decreases in the direction away from the predetermined region.

A still another method of producing an exchange coupling film of the present invention comprises a step of laminating first and second ferromagnetic layers with a Cr element layer provided therebetween, a step of forming an antiferromagnetic layer in contact with the first or second ferromagnetic layer, and a step of performing a heat treatment to produce an exchange coupling magnetic field between the antiferromagnetic layer and the first or second ferromagnetic layer. The method can form an exchange coupling film in which the Cr element content has a maximum in a predetermined region at a distance from the interface within the first or second ferromagnetic layer, and gradually decreases in the direction away from the predetermined region.

A further method of producing an exchange coupling film of the present invention comprises a step of laminating an antiferromagnetic material layer comprising an antiferromagnetic material and a Cr-containing layer the antiferromagnetic material to which a Cr element is added, to form an antiferromagnetic layer, a step of forming a ferromagnetic layer in contact with the Cr-containing layer, and a step of performing a heat treatment to produce an exchange coupling magnetic field between the antiferromagnetic layer and the ferromagnetic layer. The method can form an exchange coupling film in which the Cr element content is constant within a predetermined region of the antiferromagnetic layer near the interface between the antiferromagnetic layer and the ferromagnetic layer.

A further method comprises a step of sputtering a target composed of only an antiferromagnetic material, and a step of simultaneously sputtering the target composed of the antiferromagnetic material and a target composed of only a Cr element to mix the antiferromagnetic material and the Cr element, to form an antiferromagnetic layer containing the Cr element, a step of forming a ferromagnetic layer in contact with the antiferromagnetic layer, and a step of performing a heat treatment to produce an exchange coupling magnetic field between the antiferromagnetic layer and the ferromagnetic layer. This method can also form an exchange coupling film in which the Cr element is present at the interface between the antiferromagnetic layer and the ferromagnetic layer.

What is claimed is:

1. An exchange coupling film comprising:
   a laminate of an antiferromagnetic layer and a ferromagnetic layer, the antiferromagnetic layer containing a Cr element with a concentration gradient in the thickness direction,
   wherein the ferromagnetic layer has a magnetization direction fixed by an exchange coupling magnetic field (HEX) produced at the interface between the antiferromagnetic layer and the ferromagnetic layer, and
   wherein the antiferromagnetic layer comprises an alloy of a plurality of elements and the Cr element, and the atomic ratio (at %) of each of the plurality of elements of the alloy composition is constant relative to that of each other of the plurality of elements when the atomic ratio (at %) of Cr changes.

2. The exchange coupling film according to claim 1, wherein the Cr element is present at the interface between the antiferromagnetic layer and the ferromagnetic layer.

3. The exchange coupling film according to claim 1, wherein the antiferromagnetic layer has a region not containing the Cr element.

4. The exchange coupling film according to claim 1, wherein the Cr element concentration reaches a maximum at the interface between the antiferromagnetic layer and the ferromagnetic layer, and decreases in the direction away from the interface.

5. The exchange coupling film according to claim 1, wherein the Cr element concentration reaches a maximum in a predetermined region at a distance from the interface within the antiferromagnetic layer, and decreases in the direction away from the predetermined region.

6. The exchange coupling film according to claim 1, wherein the Cr element concentration is constant in a predetermined region of the antiferromagnetic layer near the interface between the antiferromagnetic layer and the ferromagnetic layer.

7. The exchange coupling film according to claim 1, wherein the maximum Cr element concentration in the antiferromagnetic layer is higher than that in the ferromagnetic layer.

8. The exchange coupling film according to claim 1, wherein the antiferromagnetic layer comprises a PtMn alloy, a X—Mn alloy (wherein X is at least one element of Pd, Ir, Rh, Ru, and Os), or a Pt—Mn—X' alloy (wherein X is at least one element of Pd, Ir, Rh, Ru, Au, Ag, Os, Ni, Ar, Ne, Xe, and Kr).

9. The exchange coupling film according to claim 8, wherein the antiferromagnetic layer has a CuAuI-type crystal structure.

10. The exchange coupling film according to claim 8, wherein lattice points of a crystal lattice composed of Pt and Mn, lattice points of a crystal structure composed of the element X and Mn, or lattice points of a crystal lattice composed of the elements Pt, Mn and X' are partially substituted by the Cr element.

11. The exchange coupling film according to claim 1, wherein the ferromagnetic layer has a ferrimagnetic laminated structure comprising a first magnetic layer formed juxtapositionally in contact with the antiferromagnetic layer, and a second magnetic layer opposing the first magnetic layer with a nonmagnetic intermediate layer provided therebetween.

12. The exchange coupling film according to claim 11, wherein the Cr element concentration at the interface between the first magnetic layer and the antiferromagnetic layer is higher than that at the interface between the first magnetic layer and the nonmagnetic intermediate layer.

* * * * *

UNITED STATES PATENT AND TRADEMARK OFFICE
CERTIFICATE OF CORRECTION

PATENT NO. : 7,063,904 B2
APPLICATION NO. : 10/421585
DATED : June 20, 2006
INVENTOR(S) : Kazuaki Ikarashi et al.

It is certified that error appears in the above-identified patent and that said Letters Patent is hereby corrected as shown below:

Column 36, in claim 8, line 4, after "(wherein" delete "X" and substitute --X'-- in its place.

Signed and Sealed this

Twelfth Day of December, 2006

JON W. DUDAS
*Director of the United States Patent and Trademark Office*